(12) United States Patent
Hirabayashi et al.

(10) Patent No.: US 7,569,885 B2
(45) Date of Patent: Aug. 4, 2009

(54) ELECTRO-OPTICAL DEVICE AND ELECTRONIC APPARATUS

(75) Inventors: Yukiya Hirabayashi, Suwa (JP); Takashi Sato, Tottori (JP); Yutaka Sano, Tottori (JP)

(73) Assignee: Seiko Epson Corporation, Tokyo (JP)

( * ) Notice: Subject to any disclaimer, the term of this patent is extended or adjusted under 35 U.S.C. 154(b) by 174 days.

(21) Appl. No.: 11/785,219

(22) Filed: Apr. 16, 2007

(65) Prior Publication Data

US 2007/0281430 A1    Dec. 6, 2007

(30) Foreign Application Priority Data

Jun. 1, 2006    (JP)    ............................. 2006-153106

(51) Int. Cl.
*H01L 27/01*    (2006.01)
*H01L 27/12*    (2006.01)
*H01L 31/0392*    (2006.01)

(52) U.S. Cl. ........................... 257/350; 257/59; 257/72; 257/E27.016

(58) Field of Classification Search .................. 257/59, 257/72, 350, E27.016

See application file for complete search history.

(56) References Cited

U.S. PATENT DOCUMENTS

| | | | | |
|---|---|---|---|---|
| 2004/0017531 | A1* | 1/2004 | Nagata et al. | 349/139 |
| 2007/0146251 | A1* | 6/2007 | Tsuge et al. | 345/76 |
| 2007/0205999 | A1* | 9/2007 | Akimoto et al. | 345/207 |
| 2008/0001091 | A1* | 1/2008 | Kobayashi et al. | 250/366 |

FOREIGN PATENT DOCUMENTS

JP    A 2004-303925    10/2004

* cited by examiner

*Primary Examiner*—Ngan Ngo
(74) *Attorney, Agent, or Firm*—Oliff & Berridge, PLC

(57) ABSTRACT

An electro-optical device includes pixel regions arranged at intersections of a plurality of data lines and a plurality of scanning lines on an element substrate. A sensor element, a sensor signal line for outputting a signal from the sensor element, a common wiring line, and a capacitive-coupling-operation bidirectional diode element are disposed at an end of a region on the element substrate in which the pixel regions are arranged. The capacitive-coupling-operation bidirectional diode element includes two capacitive-coupling-operation diode elements each including a semiconductor element including a source electrode, a drain electrode, a semiconductor layer having a channel region, and a gate electrode facing the channel region with a gate insulating film disposed therebetween, and a capacitor element arranged between one of the source electrode and the drain electrode and the gate electrode.

9 Claims, 15 Drawing Sheets

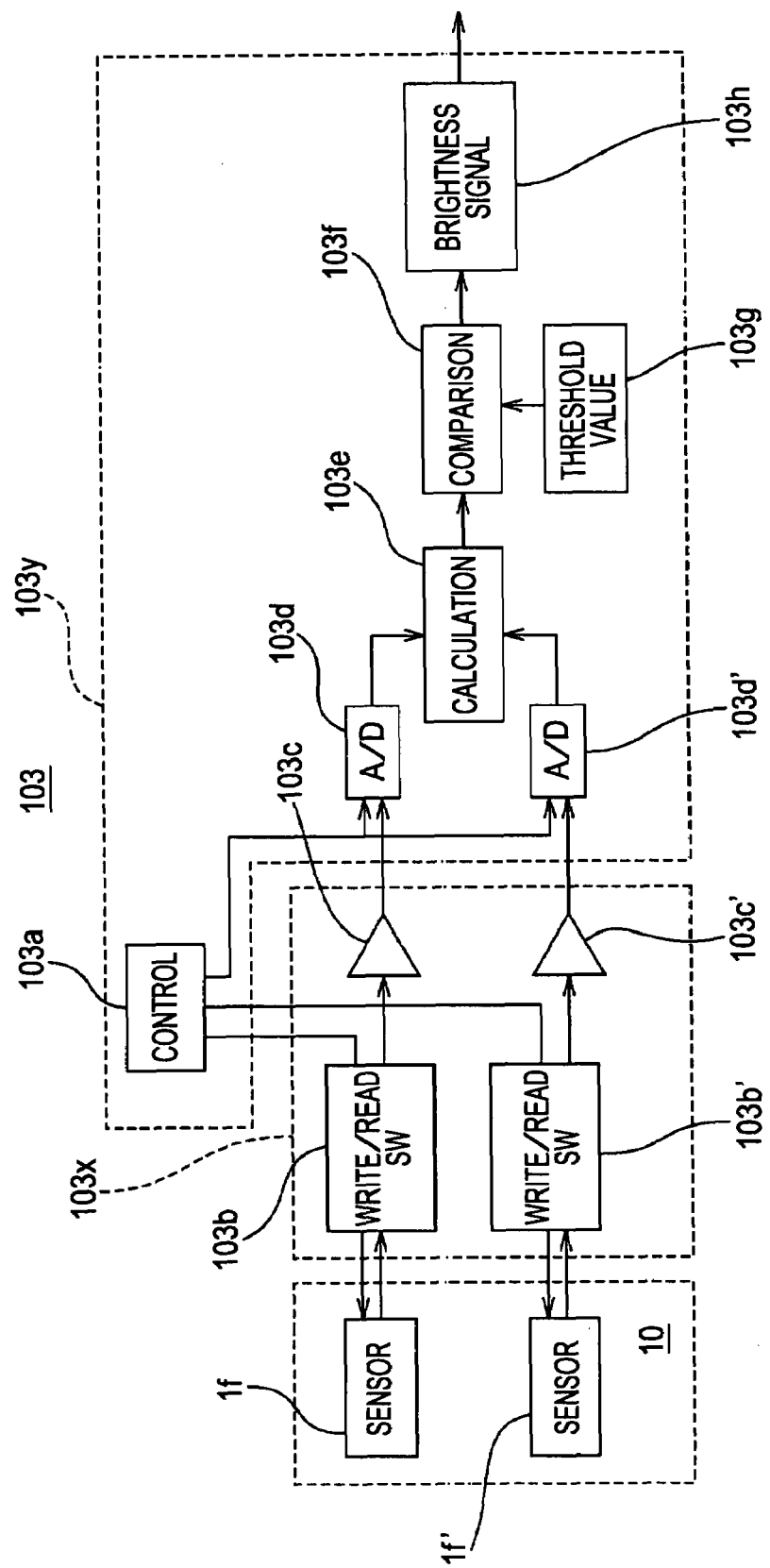

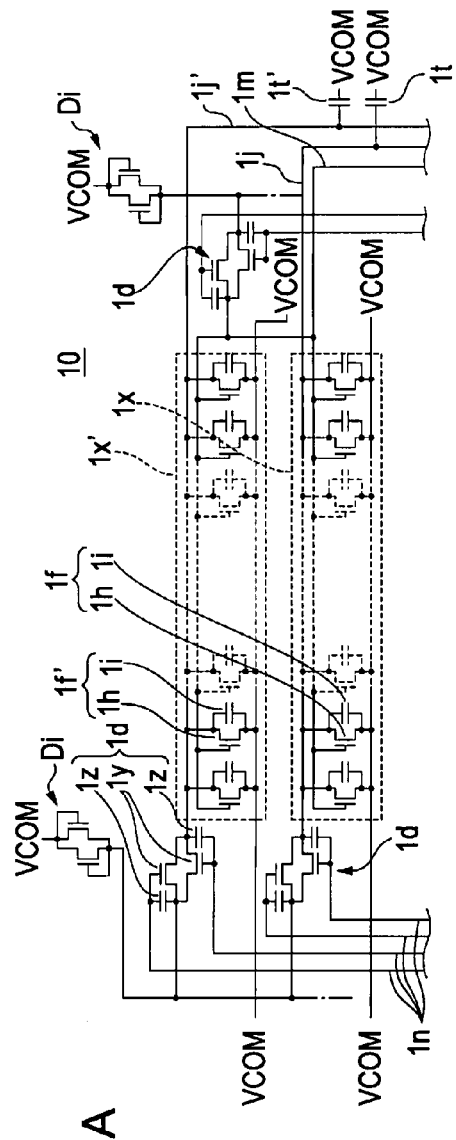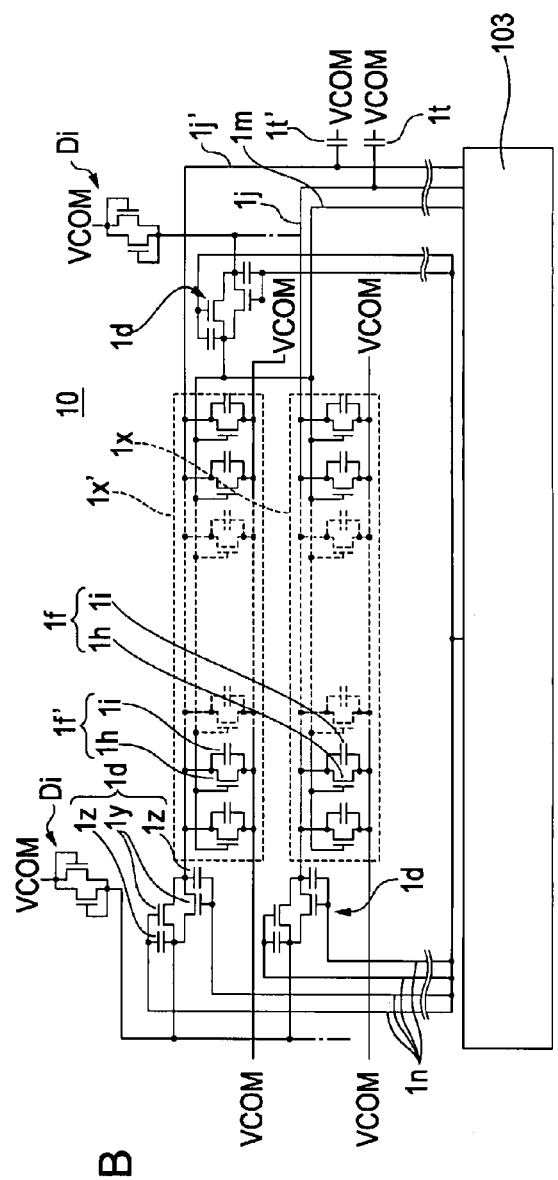
FIG. 3A
FIG. 3B

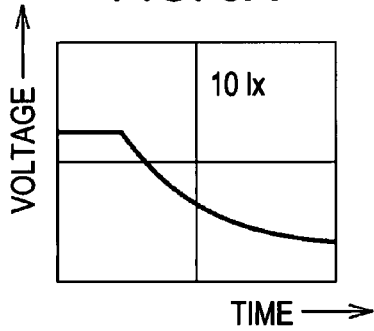
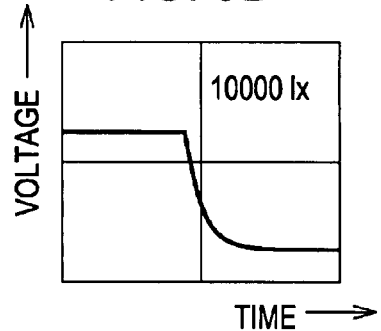
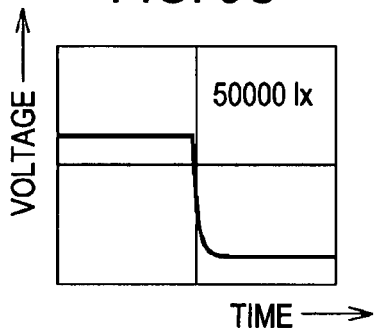
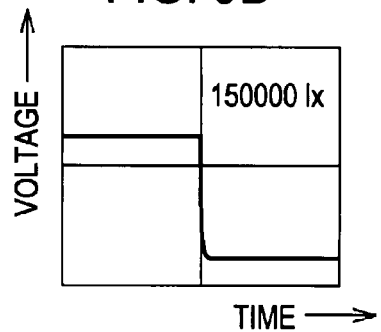
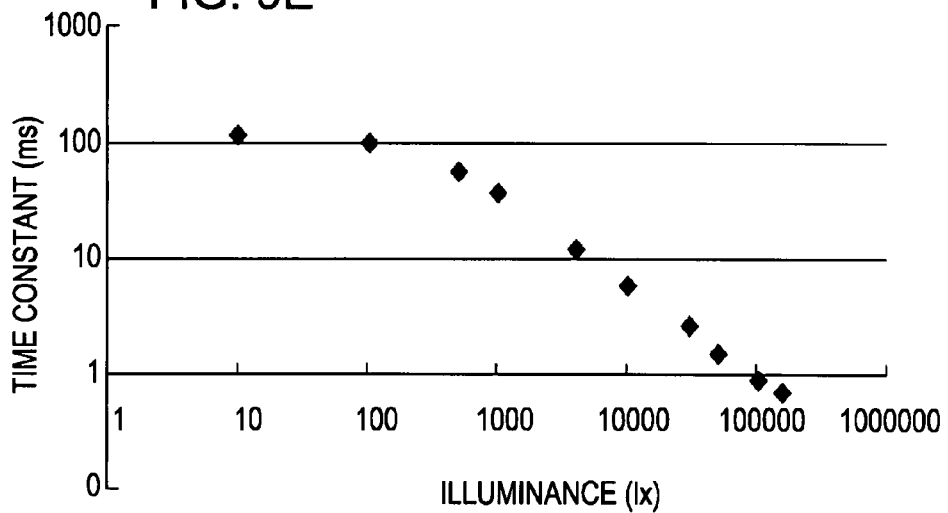

PRIOR ART

ELECTRO-OPTICAL DEVICE AND ELECTRONIC APPARATUS

BACKGROUND

1. Technical Field

The present invention relates to electro-optical devices and electronic apparatuses. More specifically, the invention relates to an electro-optical device in which signal lines are electrically connected to a common wiring line via electrostatic protection elements on an element substrate, and to an electronic apparatus including the electro-optical device.

2. Related Art

Of electro-optical devices such as liquid crystal devices, electroluminescent display devices, and image pickup devices, for example, an active-matrix liquid crystal device uses an element substrate 10 shown in FIG. 13A. On the element substrate 10, a plurality of data lines 6a and a plurality of scanning lines 3a extend orthogonally to each other, and a plurality of pixel regions 1e are arranged at intersections of the data lines 6a and the scanning lines 3a.

An insulating substrate is used as the base of the element substrate 10. Thus, a structure for preventing pixel transistors 1c arranged in the pixel regions 1e from being damaged by static electricity generated on the element substrate 10 during the manufacturing process is adopted. That is, for example, as disclosed in JP-A-2004-303925, on the element substrate 10, the data lines 6a and the scanning lines 3a are electrically connected to a common wiring line VCOM via electrostatic protection elements each formed of a bidirectional diode element Di, and the common wiring line VCOM is electrically connected to a guard ring via an electrostatic protection element formed of the bidirectional diode element Di. As shown in FIG. 13B, the bidirectional diode element Di includes semiconductor elements 1s each including a pair of source and drain electrodes, a semiconductor layer having a channel region, and a gate electrode facing the channel region with a gate insulating film disposed therebetween so that the semiconductor elements 1s are electrically connected in opposite directions to each other. In each of the semiconductor elements 1s, one of the source and drain electrodes is connected to the gate electrode.

The assignee of the invention proposes that, as shown in FIG. 14, sensor elements 1h and a sensor signal line 1j are disposed on the element substrate 10 to detect a state quantity such as illuminance or temperature so that the display operation of the liquid crystal device can be controlled according to the detected state quantity. In this case, it is preferable that the sensor signal line 1j also be electrically connected to the common wiring line VCOM in order to protect the sensor elements 1h against static electricity.

However, if the bidirectional diode element Di shown in FIG. 13B is used as an electrostatic protection element for the sensor signal line 1j, the leakage current of the bidirectional diode element Di affects the signals output from the sensor elements 1h, resulting in low detection accuracy. The low-detection-accuracy problem is solved by, as disclosed in JP-A-2004-303925, separating the bidirectional diode element Di at the final stage of the manufacturing process. However, the additional separating step decreases the productivity, and the bidirectional diode element Di may not be separated depending on the position of the bidirectional diode element Di.

SUMMARY

An advantage of some aspects of the invention is that it provides an electro-optical device in which a sensor signal line defined on an element substrate is electrically connected to a common wiring line via a bidirectional diode element to perform electrostatic protection against static electricity, wherein high-accuracy detection can be performed using sensor elements without separating the bidirectional diode element, and an electronic apparatus including the electro-optical device.

According to an aspect, the invention provides an electro-optical device including pixel regions arranged at intersections of a plurality of data lines and a plurality of scanning lines on an element substrate, wherein a sensor element, a sensor signal line for outputting a signal from the sensor element, a common wiring line, and a capacitive-coupling-operation bidirectional diode element are disposed at an end of a region on the element substrate in which the pixel regions are arranged, the capacitive-coupling-operation bidirectional diode element including two capacitive-coupling-operation diode elements each including a semiconductor element including a source electrode, a drain electrode, a semiconductor layer having a channel region, and a gate electrode facing the channel region with a gate insulating film disposed therebetween, and a capacitor element arranged between one of the source electrode and the drain electrode and the gate electrode, the two capacitive-coupling-operation diode elements being electrically connected in opposite directions to each other, the sensor signal line is electrically connected to the common wiring line via the capacitive-coupling-operation bidirectional diode element, and a control wiring line for supplying a gate voltage setting the semiconductor elements of the capacitive-coupling-operation bidirectional diode element to be in a non-conducting state is disposed for the capacitive-coupling-operation bidirectional diode element.

According to the aspect of the invention, since the sensor element is disposed on the element substrate, for example, the illuminance of the environment where the electro-optical device is placed can be detected using the sensor element, and an image can be displayed on the electro-optical device under conditions corresponding to the detected illuminance. Further, since the sensor signal line through which a signal is output from the sensor element is electrically connected to the common wiring line via the capacitive-coupling-operation bidirectional diode element, static electricity generated on the element substrate during the manufacturing process of the electro-optical device or the like can be discharged to the common wiring line via the capacitive-coupling-operation bidirectional diode element. The sensor element can therefore be protected against static electricity. The capacitive-coupling-operation bidirectional diode element connected to the sensor signal line has a structure in which a capacitor element is arranged between the gate electrode and one of the source and drain electrodes. Thus, even if a parasitic capacitance is generated between electrodes of a semiconductor element in the capacitive-coupling-operation bidirectional diode element, when a high voltage caused by static electricity is generated between the sensor signal line and the common wiring line, the capacitive coupling to the parasitic capacitance and the capacitor element allows the semiconductor element to be brought into a conducting state. The static electricity can therefore be discharged. Further, the capacitive-coupling-operation bidirectional diode element can be finished at a relatively early stage of the manufacturing process compared with a diode element whose source or drain electrode and gate electrode are connected, and static electricity generated thereafter can be discharged. The sensor element can therefore be protected against static electricity at a relatively early stage of the manufacturing process. Further, the control wiring line is disposed for the gate electrodes of the semiconductor elements of the capacitive-coupling-operation bidirectional diode element. Therefore, a predetermined gate voltage is applied to the gate electrodes from the control wiring line, thereby ensuring that the capacitive-coupling-operation bidirectional diode element can be brought into a non-conducting state. Accordingly, the capacitive-coupling-operation bidirectional diode element does not affect the signal output from the sensor element. Even in a case where the sensor signal line disposed on the element substrate is electrically connected to the common wiring line via the bidirectional diode element to perform electrostatic protection, therefore, high-accuracy detection can be performed using the sensor element without separating the bidirectional diode element.

It is preferable that each of the capacitor elements in the capacitive-coupling-operation bidirectional diode element is formed by arranging the one of the source electrode and the drain electrode so as to face the gate electrode with an insulation film disposed therebetween. With this structure, the capacitive-coupling-operation bidirectional diode element can be finished at a relatively early stage of the manufacturing process, and the sensor element can be protected against static electricity at the relatively early stage of the manufacturing process.

The electro-optical device may be configured such that the sensor element includes a semiconductor element including a source electrode, a drain electrode, a semiconductor layer having a channel region, and a gate electrode facing the channel region with the gate insulating film disposed therebetween, and a capacitor element electrically connected to the semiconductor element, and that after the capacitor element is charged, a state quantity is detected on the basis of a characteristic of discharging performed via the semiconductor element of the sensor element.

It is preferable that the source electrodes, the drain electrodes, the semiconductor layers, and the gate electrodes of the capacitive-coupling-operation bidirectional diode element are made of the same materials as the materials of the source electrode, the drain electrode, the semiconductor layer, or the gate electrode of the sensor element, respectively, and that a pair of layers between which the source electrodes, the drain electrodes, the semiconductor layers, or the gate electrodes of the capacitive-coupling-operation bidirectional diode element are disposed is the same as a pair of layers between which the source electrode, the drain electrode, the semiconductor layer, or the gate electrode of the sensor element is disposed, respectively. With this structure, the capacitive-coupling-operation bidirectional diode element and the sensor element can be fabricated using a common manufacturing process.

The channel region of the sensor element can be formed of an amorphous silicon film, a polycrystalline polysilicon film fabricated in a low-temperature process, a polycrystalline polysilicon film fabricated in a high-temperature process, or the like. Of these semiconductor films, the amorphous silicon film is used as the channel region of the sensor element, thereby realizing a sensor element having high sensitivity to the illuminance or the like.

The sensor element may be, for example, an optical sensor element. Alternatively, the sensor element may be a temperature sensor element.

It is preferable that each of the pixel regions includes a pixel transistor including a source electrode, a drain electrode, a semiconductor layer having a channel region, and a gate electrode facing the channel region with the gate insulating film disposed therebetween, and a pixel electrode electrically connected to the pixel transistor, that the source electrodes, the drain electrodes, the semiconductor layers, and the gate electrodes of the pixel transistors are made of the same materials as the materials of the source electrodes, the drain electrodes, the semiconductor layers, or the gate electrodes of the capacitive-coupling-operation bidirectional diode element, respectively, and that a pair of layers between which the source electrodes, the drain electrodes, the semiconductor layers, or the gate electrodes of the pixel transistors are disposed is the same as a pair of layers between which the source electrodes, the drain electrodes, the semiconductor layers, and the gate electrodes of the capacitive-coupling-operation bidirectional diode element are disposed, respectively. With this structure, the pixel transistors and the capacitive-coupling-operation bidirectional diode element can be fabricated using a common manufacturing process.

According to another aspect, the invention provides an electronic apparatus including the above-described electro-optical device. The electronic apparatus may be a mobile phone or a mobile computer.

BRIEF DESCRIPTION OF THE DRAWINGS

The invention will be described with reference to the accompanying drawings, wherein like numbers reference like elements.

FIG. 2B is a block diagram showing the structure of a sensor-drive IC of the liquid crystal device shown in FIGS. 1A and 1B.

FIG. 3A is a block diagram showing the electrical structure of a sensor element and the like before an external circuit is mounted on the element substrate of the liquid crystal device shown in FIGS. 1A and 1B.

FIG. 3B is a block diagram showing the electrical structure of the sensor element and the like after the external circuit has been mounted.

FIGS. 9A to 9D are graphs showing the discharge characteristic in the sensor element shown in FIGS. 7A to 7C.

FIG. 9E is a graph showing the relationship between the time constant and the illuminance in the sensor element shown in FIGS. 7A to 7C.

DESCRIPTION OF EXEMPLARY EMBODIMENTS

Figure 13A:
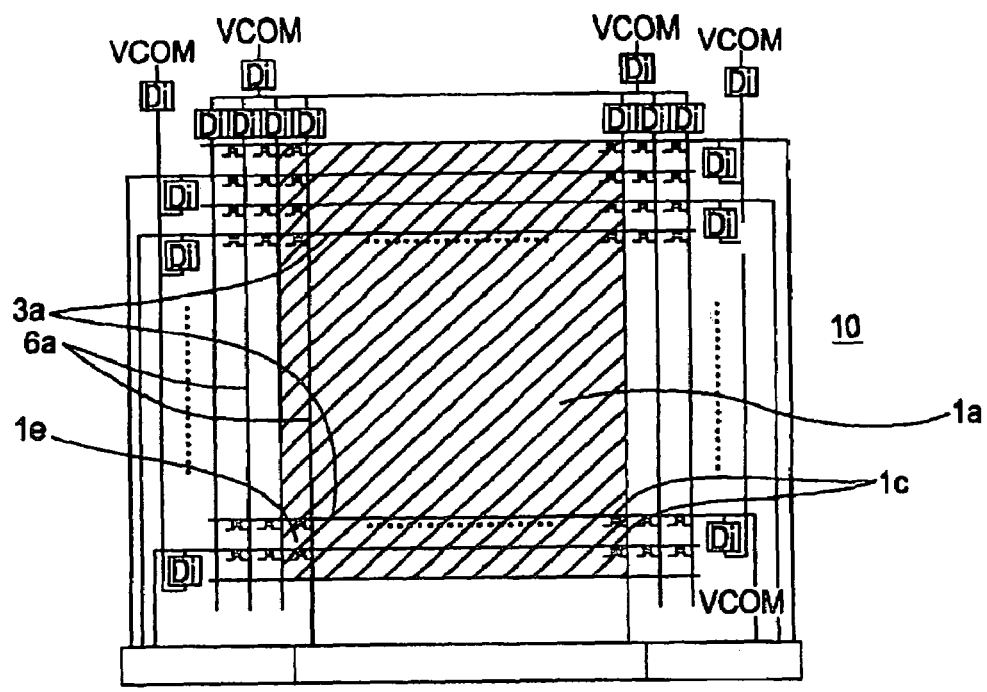
FIGS. 13A and 13B are block diagrams showing the electrical structure of an element substrate used in a liquid crystal device of the related art.
Figure 13B:
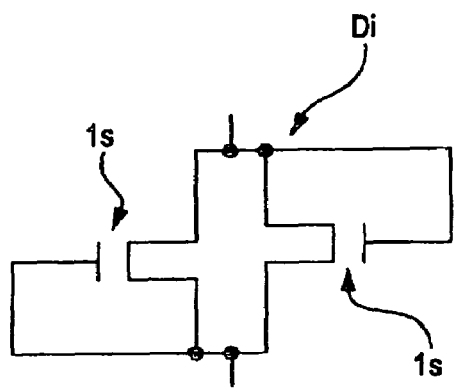
Figure 14:
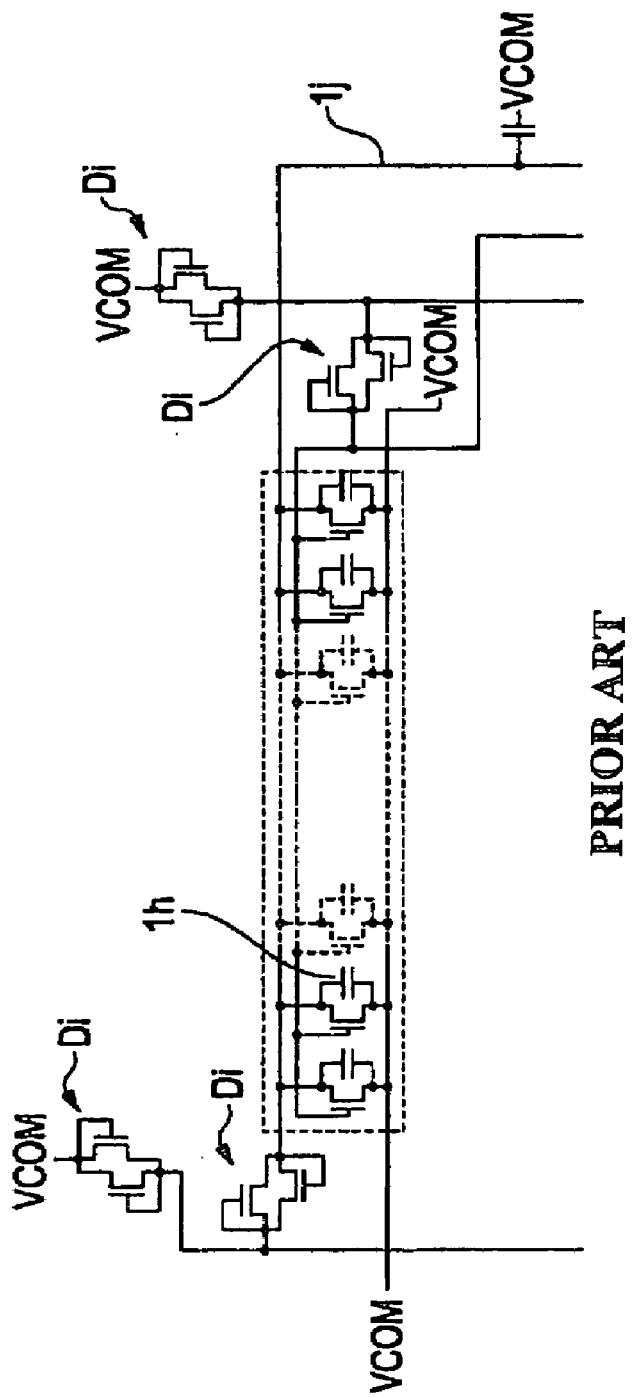
FIG. 14 is a block diagram showing a reference example in which sensor elements are incorporated in the liquid crystal device of the related art.

Exemplary embodiments of the invention will now be described with reference to the drawings. In the figures used in conjunction with the following embodiments, layers and parts are illustrated in different scales so as to allow recognition of the layers and parts in the figures. In the following description, parts having the same or similar functions to those shown in FIGS. 13A to 14 are represented by the same reference numerals so as to clarify the correspondences therebetween. In the following description, further, a pixel transistor, a bidirectional diode element, a capacitive-coupling-operation bidirectional diode element, and a sensor element have a MIS-type semiconductor element structure including a pair of source and drain electrodes. When the pair of source and drain electrodes is separately identified, for the convenience of description, the source and drain electrodes are distinguished by focusing on the direction in which a current flows in a channel region for a certain period.

Overall Structure of Liquid Crystal Device

Figure 1A:
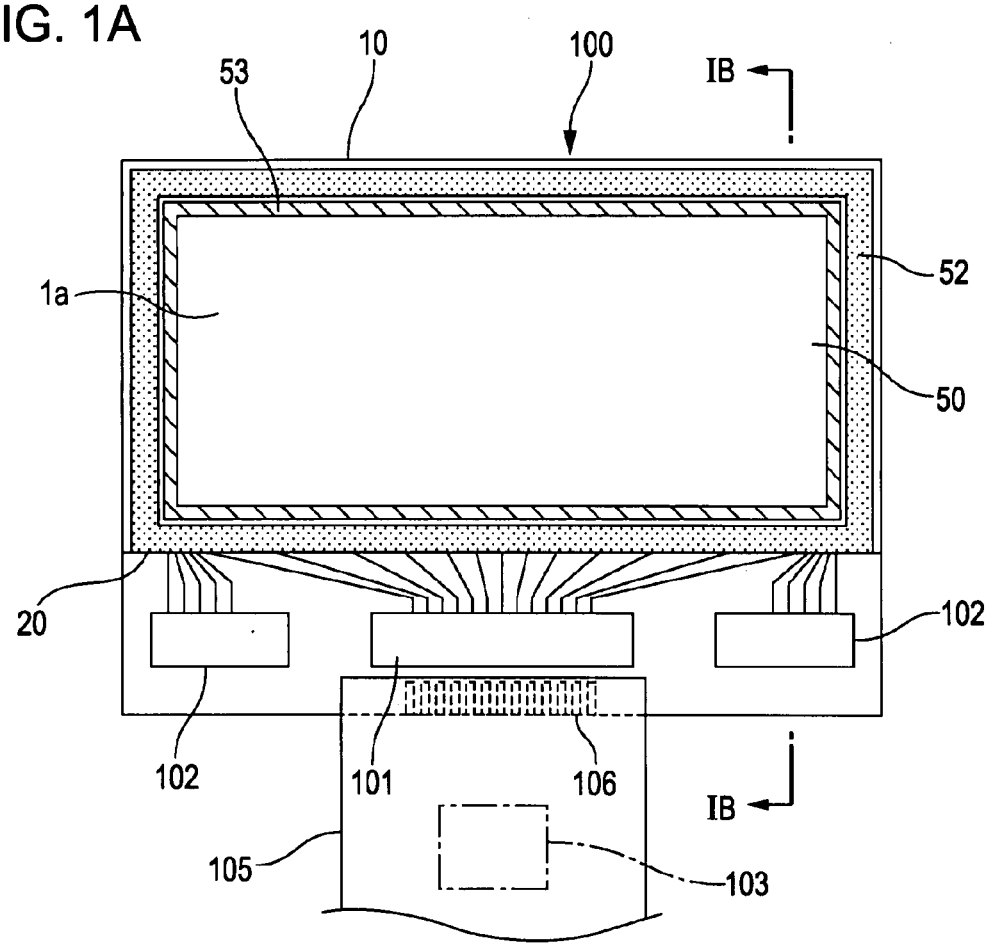
FIG. 1A is a plan view of a liquid crystal device (electro-optical device) and components incorporated therein as viewed from the side of a counter substrate.
Figure 1B:
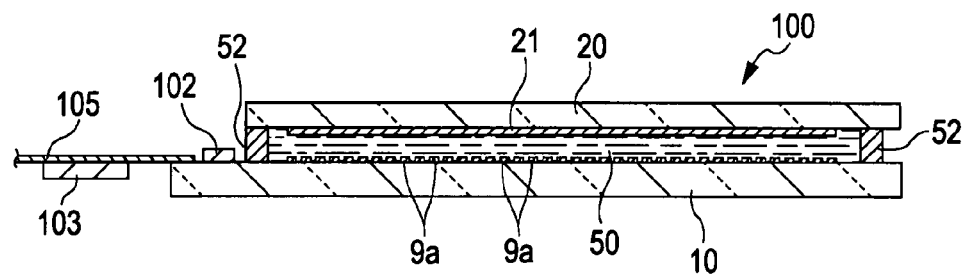
FIG. 1B is a cross-sectional view taken along a line IB-IB of FIG. 1A.

FIG. 1A is a plan view of a liquid crystal device (electro-optical device) and components incorporated therein as viewed from the side of a counter substrate, and FIG. 1B is a cross-sectional view taken along a line IB-IB of FIG. 1A. In FIGS. 1A and 1B, a liquid crystal device 100 according to an embodiment of the invention is a transmissive active-matrix liquid crystal device of the TN (Twisted Nematic) mode, ECB (Electrically Controlled Birefringence) mode, or VAN (Vertical Aligned Nematic) mode. In the liquid crystal device 100, an element substrate 10 and a counter substrate 20 are bonded to each other through a seal 52, and a liquid crystal 50 is held between the element substrate 10 and the counter substrate 20.

Drive ICs 101 and 102 including a scanning line driving circuit and a data line driving circuit are mounted on the element substrate 10 so as to be located in an edge region defined outside the seal 52, and a mounting terminal 106 is disposed along a side of the element substrate 10. The seal 52 is an adhesive made of a photocurable resin, a thermosetting resin, or the like for bonding the element substrate 10 and the counter electrode 20 at the peripheries thereof, and is mixed with a gap material such as glass fibers or glass beads for ensuring a predetermined distance between the substrates 10 and 20. Although not shown in FIGS. 1A and 1B, the seal 52 is partially cut out to form a liquid-crystal-injection port, which is sealed by a sealing agent after the liquid crystal 50 is injected through the liquid-crystal-injection port.

The element substrate 10 includes pixel transistors, described below, and pixel electrodes 9a arranged in a matrix, and an alignment film (not shown) is overlaid on the pixel electrodes 9a. The counter substrate 20 includes a frame-shaped area 53 (not shown in FIG. 1B) made of a light-shielding material along the inner periphery of the seal 52, and an image display region 1a defined by the inner surface of the frame-shaped area 53. A light-shielding film called black matrix or black stripe (not shown) is disposed on the counter substrate 20 so as to face the vertical and horizontal boundaries of pixel regions, and a counter electrode 21 and an alignment film (not shown) are disposed on the top layer of the light-shielding film. Although not shown in FIG. 1B, RGB color filters with protection films are arranged on the counter substrate 20 so as to face the pixel regions defined on the element substrate 10. The liquid crystal device 100 can therefore be used as a color display device of an electronic apparatus such as a mobile computer, a mobile phone, and a liquid crystal television set.

At an edge of the element substrate 10, a flexible wiring substrate 105 is connected to the mounting terminal 106. The flexible wiring substrate 105 has mounted thereon a sensor-drive IC 103 including a sensor control circuit for controlling sensor elements, described below.

While the drive ICs 101 and 102 are illustrated as three units including a scanning line driving circuit and data line driving circuits, respectively, by way of example, the drive ICs 101 and 102 may be formed of a single drive IC including both a scanning line driving circuit and a data line driving circuit. In the embodiment, the sensor-drive IC 103 is mounted on the flexible wiring substrate 105. Alternatively, the sensor-drive IC 103 may be mounted on the element substrate 10, or the sensor control-circuit and the like may be built in the same IC as the scanning line driving circuit and the data line driving circuit.

Overall Structure of Element Substrate 10

Figure 2A:
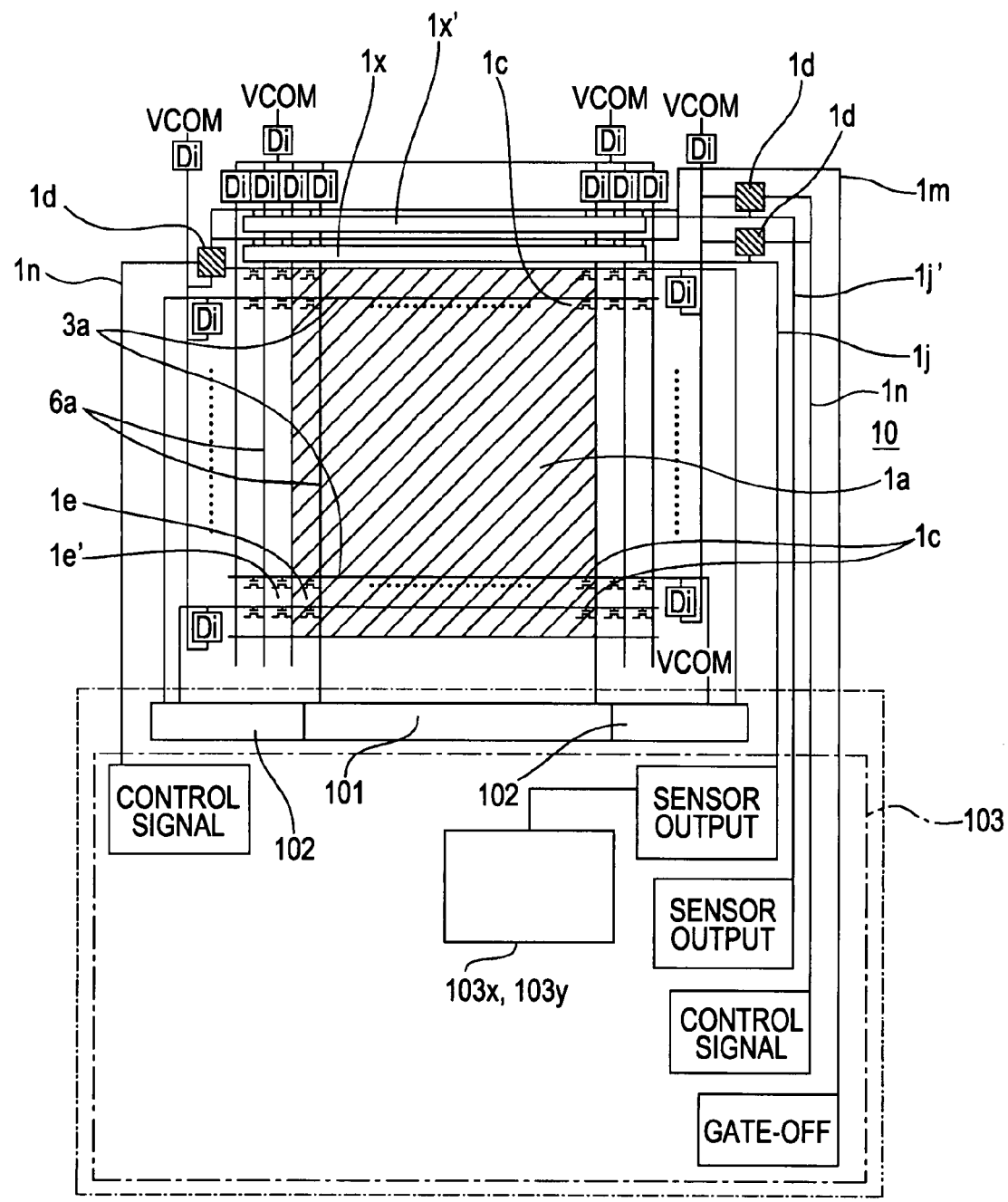
FIG. 2A is a block diagram showing the electrical structure of an element substrate of the liquid crystal device shown in FIGS. 1A and 1B.

FIG. 2A is a block diagram showing the electrical structure of the element substrate 10 of the liquid crystal device 100 shown in FIGS. 1A and 1B, and FIG. 2B is a block diagram showing the structure of the sensor-drive IC 103.

As shown in FIG. 2A, on the element substrate 10, a plurality of data lines (source lines) 6a and scanning lines (gate lines) 3a are arranged in a region corresponding to the image display region 1a (as shown by shading) so that the data lines 6a and the scanning lines 3a orthogonally intersect each other, and a plurality of pixel regions 1e are arranged at the intersections of the data lines 6a and the scanning lines 3a. Pixel transistors 1c for controlling the alignment of the liquid crystal are disposed in the pixel regions 1e, and are formed of MIS-type semiconductor elements (thin-film transistors). Sources of the pixel transistors 1c are electrically connected to the data lines 6a, and gates of the pixel transistors 1c are electrically connected to the scanning lines 3a. Dummy pixel regions 1e' having the same structure as the pixel regions 1e are disposed around the image display region 1a. The data lines 6a and the scanning lines 3a extend from the drive ICs 101 and 102, respectively. The element substrate 10 may include a capacitor line (not shown) for forming a hold capacitor for each pixel. If hold capacitors are configured between the adjacent scanning lines 3a, no capacitor lines are required.

The base of the element substrate 10 is formed of an insulating substrate such as a glass substrate. If static electricity is generated in the data lines 6a or the scanning lines 3a during the manufacturing process, the pixel transistors 1c may be damaged by the static electricity. For example, when the element substrate 10 is exposed to plasma during film deposition or etching of the element substrate 10 or when the element substrate 10 is brought into contact with a conveying arm during conveying, the element substrate 10 is electrostatically charged, and static electricity may be generated in the data lines 6a or the scanning lines 3a. A wiring called a guard ring (not shown) is disposed around a region to be cut out to form the element substrate 10 from a large-size substrate. The guard ring is connected to a common wiring line VCOM defined on the element substrate 10 via a bidirectional diode element Di, and electrostatic protection elements each formed of the bidirectional diode element Di are arranged between the common wiring line VCOM and the data lines 6a and between the common wiring line VCOM and the scanning lines 3a. Thus, static electricity generated in the data lines 6a and the scanning lines 3a during the manufacturing process of the element substrate 10 can be discharged to the common wiring line VCOM via the bidirectional diode elements Di, and static electricity generated in the common wiring line VCOM can be discharged to the guide ring via the bidirectional diode element Di. Accordingly, the pixel transistors 1c can be protected against static electricity in the manufacturing process of the element substrate 10. Although the guide ring has been separated from the element substrate 10 when the element substrate 10 is used in the liquid crystal device 100, the bidirectional diode elements Di still remain on the element substrate 10. As described below, each of the bidirectional diode elements Di has a structure in which two MIS-type semiconductor elements 1s each formed of a MIS-type diode whose drain and gate are connected are connected in parallel in opposite directions to each other. Due to the easy control of a threshold voltage and relatively low leakage current, the bidirectional diode elements Di still remaining on the element substrate 10 at the stage of fabrication of the liquid crystal device 100 have no problem with the display operation and the like.

Detailed Structure of Element Substrate 10

FIGS. 3A and 3B are block diagrams showing the electrical structure of sensor elements and the like disposed on the element substrate 10 of the liquid crystal device 100 shown in FIGS. 1A and 1B. FIG. 3A shows the state before an external circuit is mounted on the element substrate 10, and FIG. 3B shows the structure after the external circuit has been mounted.

As shown in FIGS. 2A, 3A, and 3B, the element substrate 10 used in the liquid crystal device 100 of the embodiment includes a sensor-element forming region 1x including a plurality of sensor elements 1f for detecting a state quantity such as illuminance. The sensor-element forming region 1x is disposed at an edge of the pixel display region 1a (at an edge of the region where the pixel regions 1e are arranged) so as to extend along one side of the pixel display region 1a. A reference-sensor-element forming region 1x' including a plurality of reference sensor elements 1f' used for comparison in the detection process using the sensor elements 1f is disposed outside the sensor-element forming region 1x. While external light reaches the sensor-element forming region 1x, the reference-sensor-element forming region 1x' is covered with the light-shielding film defined on the counter substrate 20 and a frame of the liquid crystal device 100, and external light does not reach the reference-sensor-element forming region 1x'.

Each of the sensor elements 1f and 1f' includes an MIS-type semiconductor element 1h and a capacitor element 1i electrically connected in parallel with the semiconductor element 1h. The structure of the sensor elements 1f and 1f' is described in detail below.

The element substrate 10 further includes, at the edge of the region where the pixel regions 1e are arranged, sensor signal lines 1j and 1j' for outputting signals from first electrodes (the drain electrodes) of the pairs of source and drain electrodes of the sensor elements 1f and 1f'. The sensor signal lines 1j and 1j' are electrically connected to the sensor-drive IC 103. The sensor signal lines 1j and 1j' are also electrically connected to the common wiring line VCOM via noise filter elements 1t and 1t' each formed of a capacitor, respectively.

The element substrate 10 further includes a common gate-off wiring line 1m extending from the sensor-drive IC 103 toward the sensor-element forming region 1x and the reference-sensor-element forming region 1x'. The gate-off wiring line 1m is branched midway and electrically connected to gate electrodes of the sensor elements 1f disposed in the sensor-element forming region 1x and gate electrodes of the reference sensor elements 1f' disposed in the reference-sensor-element forming region 1x'. Second electrodes (the source electrodes) of the pairs of source and drain electrodes of the sensor elements 1f and 1f' are electrically connected to the common wiring line VCOM.

On the element substrate 10 with the above-described structure, electrostatic protection elements each formed of a capacitive-coupling-operation bidirectional diode element 1d are disposed at the edge of the region where the pixel regions 1e are arranged, and are arranged between the sensor signal lines 1j and 1j' and the common wiring line VCOM for protecting the sensor elements 1f and 1f' against static electricity. An electrostatic protection element formed of the capacitive-coupling-operation bidirectional diode element 1d is further arranged between the gate-off wiring line 1m and the common wiring line VCOM.

Each of the capacitive-coupling-operation bidirectional diode elements 1d includes MIS-type diode elements (capacitive-coupling-operation bidirectional diode elements) each including a MIS-type semiconductor element 1y and a capacitor element 1z arranged between the gate electrode of the semiconductor element 1y and one of the source and drain electrode (the drain electrode) so that the MIS-type diode elements are connected in parallel in opposite directions to each other. The structure of the capacitive-coupling-operation bidirectional diode element 1d is described in detail below.

The element substrate 10 further includes a control wiring line 1n for supplying a gate voltage setting the semiconductor elements 1y of the capacitive-coupling-operation bidirectional diode elements 1d to be in a non-conducting state to the gate electrodes of the semiconductor elements 1y. The control wiring line in extends from the sensor-drive IC 103, and is electrically connected to the gate electrodes of the semiconductor elements 1y.

As shown in FIG. 2B, the sensor-drive IC 103 includes an input control unit 103x and a signal processing unit 103y for performing signal processing and the like on the sensor elements 1*f* and 1*f'*. The input control unit 103*x* allows the sensor elements 1*f* and 1*f'* to output signals under control of a control unit 103*a* such as a central processing unit (CPU). The signal processing unit 103*y* processes the signals output from the sensor elements 1*f* and 1*f'*. The input control unit 103*x* further includes switch circuits 103*b* and 103*b'* for switching the signals input from the sensor elements 1*f* and 1*f'*, and amplifier circuits 103*c* and 103*c'* for amplifying the sensor outputs input via the switch circuits 103*b* and 103*b'*. The signal processing unit 103*y* includes analog-to-digital (A/D) converter circuits 103*d* and 103*d'* for performing analog-to-digital conversion on the sensor outputs, a calculation circuit 103*e* for performing subtraction between the outputs from the reference sensor elements 1*f'* and the outputs from the sensor elements 1*f*, a comparator circuit 103*f* for comparing the sensor signals obtained by the calculation circuit 103*e* with a threshold value 103*g*, and a signal output unit 103*h* for determining brightness signals (illuminance signals) on the basis of the comparison results of the comparator circuit 103*f* and outputting the results.

Structure of Pixel Transistors 1*c*

Figure 4A:
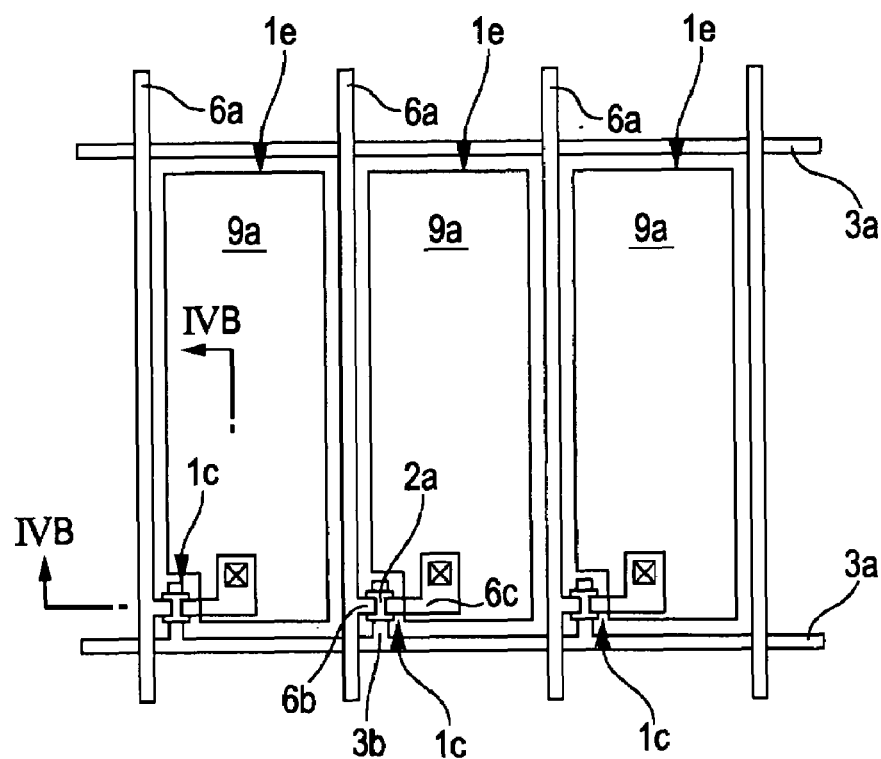
FIG. 4A is a plan view showing three pixel regions arranged on the element substrate used in the liquid crystal device shown in FIGS. 1A and 1B.
Figure 4B:
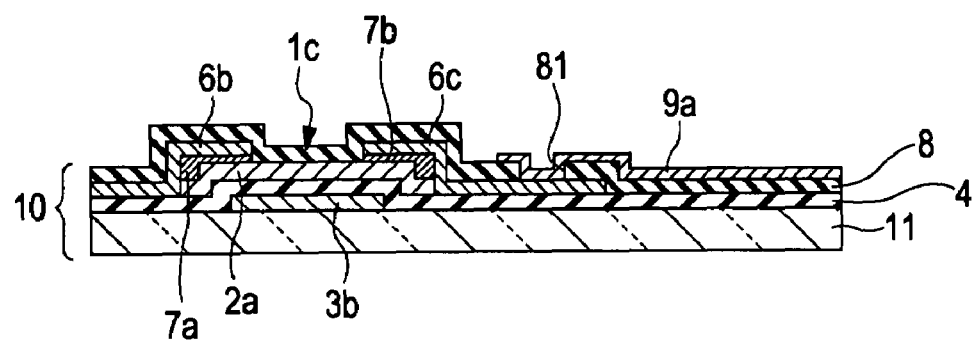
FIG. 4B is a cross-sectional view taken along a line IVB-IVB of FIG. 4A.

FIG. 4A is a plan view of three of the pixel regions 1*e* defined on the element substrate 10, and FIG. 4B is a cross-sectional view taken along a line IVB-IVB of FIG. 4A. As shown in FIG. 4A, each of the pixel regions 1*e* defined by the data lines 6*a* and the scanning lines 3*a* includes a semiconductor layer 2*a* having a channel region of the pixel transistor 1*c* formed of a bottom-gate thin-film transistor. A gate electrode 3*b* is formed of a projecting portion of each of the scanning lines 3*a*. A source electrode 6*b*, which is a portion of each of the data lines 6*a*, overlaps at the source-side end of each of the semiconductor layers 2*a*, and a drain electrode 6*c* overlaps at the drain-side end thereof. The pixel electrodes 9*a* are electrically connected to the drain electrodes 6*c* via contact holes 81.

The cross-section of each of the pixel transistors 1*c* having the above-described structure is shown in FIG. 4B. First, the scanning line 3*a* (the gate electrode 3*b*) is disposed on an insulating substrate 11 formed of a glass substrate or a quartz substrate. A gate insulating film 4 is disposed on the top layer of the gate electrode 3*b*. The semiconductor layer 2*a* having the channel region of the pixel transistor 1*c* is disposed on the top layer of the gate insulating film 4 so as to partially overlap the gate electrode 3*b*. An ohmic contact layer 7*a* formed of a doped silicon film and the source electrode 6*b* are laminated on the top layer of the source region of the semiconductor layer 2*a*, and an ohmic contact layer 7*b* formed of a doped silicon film and the drain electrode 6*c* are laminated on the top layer of the drain region of the semiconductor layer 2*a*.

The gate insulating film 4 is formed of, for example, a silicon nitride film. The scanning line 3*a* is, for example, a multi-layer film formed of an aluminum alloy film and a molybdenum film. The semiconductor layer 2*a* is formed of, for example, an amorphous silicon film, and each of the ohmic contact layers 7*a* and 7*b* is formed of, for example, an n$^+$ amorphous silicon film doped with phosphorus. The data line 6*a* (the source electrode 6*b*) and the drain electrode 6*c* have a three-layer structure in which, for example, a molybdenum film, an aluminum film, and a molybdenum film are laminated in the stated order from the bottom to the top.

A passivation film 8 (protection film/interlayer insulation film) is disposed on the top layer of the source electrode 6*b* and the drain electrode 6*c*. The passivation film 8 is formed of, for example, a silicon nitride film. The pixel electrode 9*a* is disposed on the top layer of the passivation film 8, and is electrically connected to the drain electrode 6*c* via the contact hole 81 defined in the passivation film 8. The pixel electrode 9*a* is formed of, for example, an indium tin oxide (ITO) film.

Structure of Bidirectional Diode Element Di

Figure 5A:
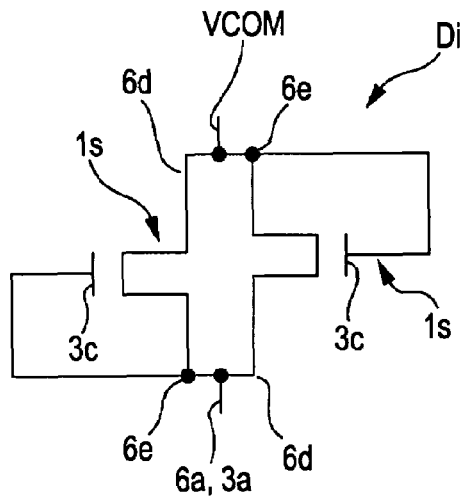
FIGS. 5A and 5B are an equivalent circuit diagram and a plan view of a bidirectional diode disposed on the element substrate used in the liquid crystal device shown in FIGS. 1A and 1B, respectively.
Figure 5B:
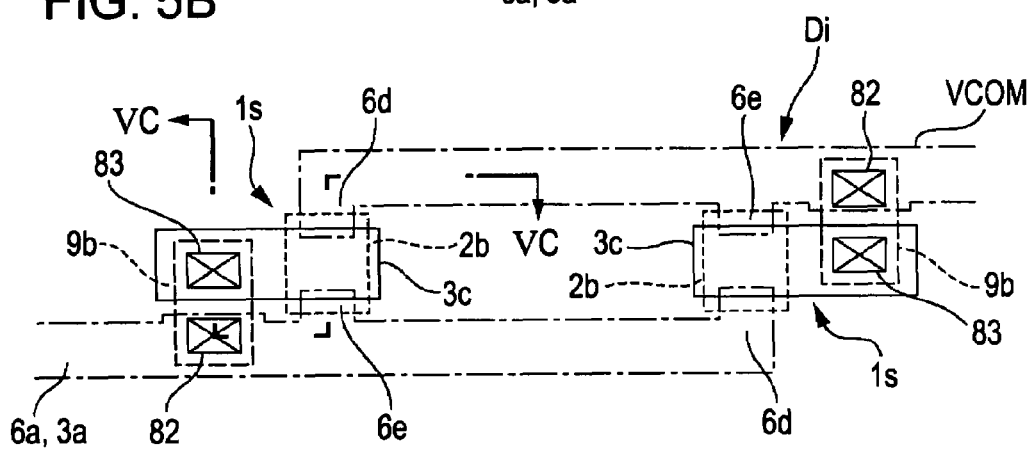
Figure 5C:
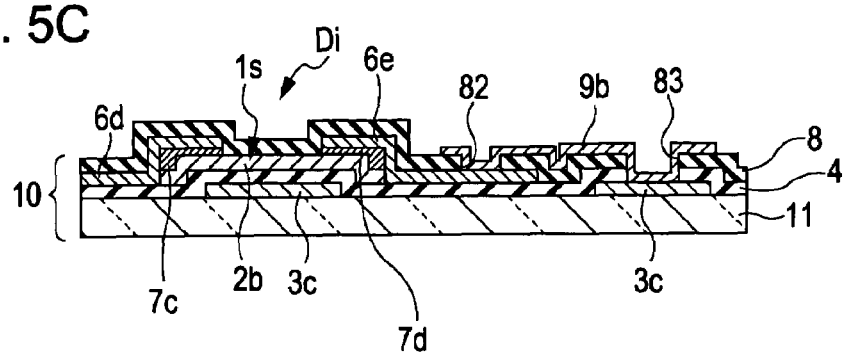
FIG. 5C is a cross-sectional view taken along a line VC-VC of FIG. 5B.

FIGS. 5A and 5B are an equivalent circuit diagram and a plan view of each of the bidirectional diodes Di disposed on the element substrate 10, respectively, and FIG. 5C is a cross-sectional view taken along a line VC-VC of FIG. 5B. As shown in FIGS. 5A, 5B, and 5C, the bidirectional diode element Di includes two MIS-type semiconductor elements 1*s* each including a pair of source and drain electrodes 6*d* and 6*e*, a semiconductor layer 2*b* having a channel region, and a gate electrode 3*c* facing the channel region with the gate insulating film 4 disposed therebetween so that the two MIS-type semiconductor elements 1*s* are electrically connected in parallel in opposite directions to each other. Each of the semiconductor elements 1*s* has a structure in which the drain electrode 6*e* in the pair of source and drain electrodes 6*d* and 6*e* is connected to the gate electrode 3*c*. The drain electrode 6*e* of one of the semiconductor elements 1*s* and the source electrode 6*d* of the other semiconductor element 1*s* are connected to the data line 6*a* or the scanning line 3*a*, and the source electrode 6*d* of the one semiconductor element 1*s* and the drain electrode 6*e* of the other semiconductor element 1*s* are connected to the common wiring line VCOM.

In the bidirectional diode element Di with the above-described structure, the pair of semiconductor elements 1*s* has the same structure. The cross-sectional structure of the semiconductor elements 1*s* will be described with reference to FIG. 5C. As shown in FIG. 5C, in the bidirectional diode element Di, as in each of the pixel transistors 1*c*, the gate electrode 3*c* of each of the semiconductor elements 1*s* is disposed on the insulating substrate 11, and the gate insulating film 4 is disposed on the top layer of the gate electrode 3*c* so as to cover the gate electrode 3*c*. The semiconductor layer 2*b* having the channel region is disposed on the top layer of the gate insulating film 4 so as to partially overlap the gate electrode 3*c*. An ohmic contact layer 7*c* formed of a doped silicon film and the source electrode 6*d* in the source and drain electrodes 6*d* and 6*e* are laminated at one end of the semiconductor layer 2*b*, and an ohmic contact layer 7*d* formed of a doped silicon film and the drain electrode 6*e* in the source and drain electrodes 6*d* and 6*e* are laminated at the other end of the semiconductor layer 2*b*. The passivation film 8 is disposed on the top layer of the source and drain electrodes 6*d* and 6*e*. A relay electrode 9*b* formed of an ITO film is disposed on the top layer of the passivation film 8. The relay electrode 9*b* is electrically connected to the drain electrode 6*e* via a contact hole 82 defined in the passivation film 8, and is electrically connected to the gate electrode 3*c* via a contact hole 83 defined in the passivation film 8 and the gate insulating film 4.

The source and drain electrodes, the semiconductor layers, and the gate electrodes of the bidirectional diode elements Di are made of the same materials as those of the pixel transistors 1*c*, and are disposed between the same pairs of layers as those of the pixel transistors 1*c*. The relay electrodes 9*b* of the bidirectional diode elements Di are made of the same material as that of the pixel electrodes 9*a* of the pixel transistors 1*c*, and are disposed on the same layer as that of the pixel electrodes 9*a* of the pixel transistors 1*c*. The bidirectional diode elements Di and the pixel transistors 1*c* can therefore be fabricated using a common process.

Structure of Capacitive-Coupling-Operation Bidirectional Diode Element 1*d*

Figure 6A:
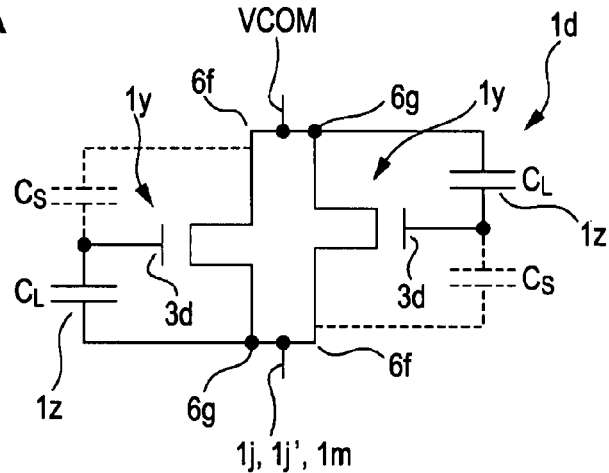
FIGS. 6A and 6B are an equivalent circuit diagram and a plan view of a capacitive-coupling-operation bidirectional diode element disposed on the element substrate used in the liquid crystal device shown in FIGS. 1A and 1B, respectively.
Figure 6B:
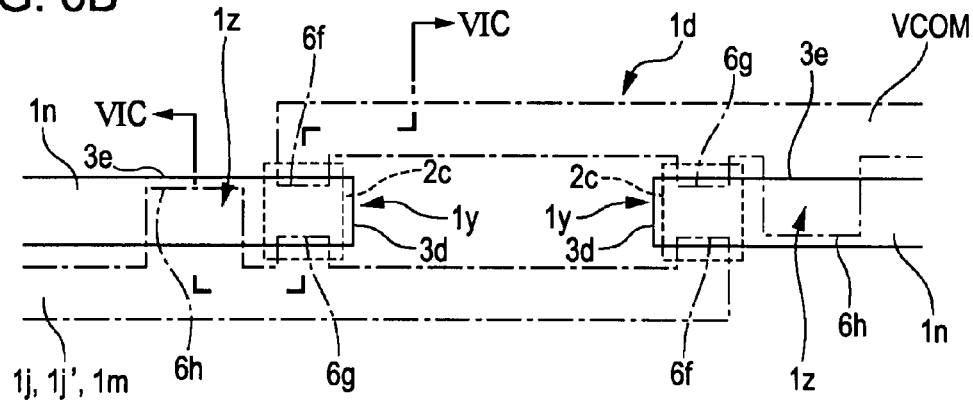
Figure 6C:
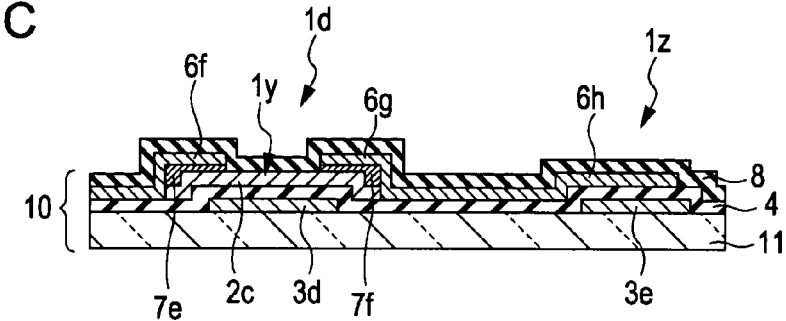
FIG. 6C is a cross-sectional view taken along a line VIC-VIC of FIG. 6B.
Figure 7A:
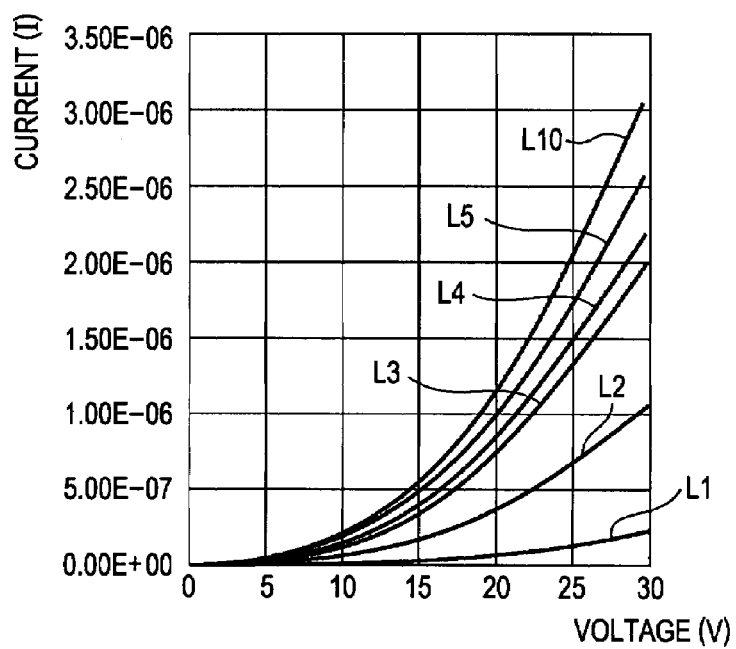
FIGS. 7A and 7B are a graph showing I-V characteristics of the bidirectional diode element shown in FIGS. 5A to 6C, and a graph showing the results on a logarithmic scale, respectively.
Figure 7B:
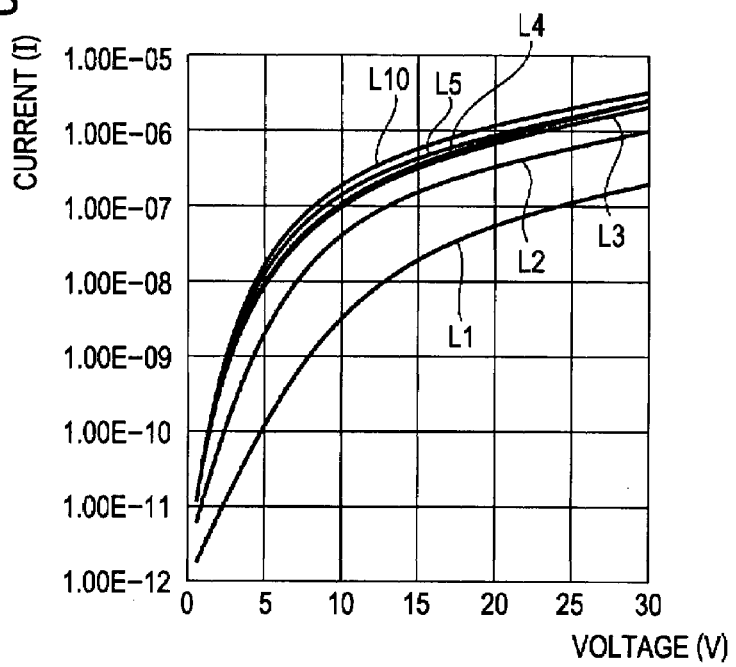

FIGS. 6A and 6B are an equivalent circuit diagram and a plan view of each of the capacitive-coupling-operation bidirectional diode elements 1d disposed on the element substrate 10, respectively. FIG. 6C is a cross-sectional view taken along a line VIC-VIC of FIG. 6B. FIGS. 7A and 7B are a graph showing I-V characteristics of the capacitive-coupling-operation bidirectional diode element 1d shown in FIGS. 6A to 6C and the bidirectional diode element Di shown in FIGS. 5A to 5C, and a graph showing the results on a logarithmic scale, respectively.

As shown in FIGS. 6A, 6B, and 6C, the capacitive-coupling-operation bidirectional diode element 1d includes two MIS-type semiconductor elements 1y each including a pair of source and drain electrodes 6f and 6g, a semiconductor layer 2c having a channel region, and a gate electrode 3d facing the channel region with the gate insulating film 4 disposed therebetween so that the two MIS-type semiconductor elements 1y are electrically connected in opposite directions to each other. Each of the semiconductor elements 1s has a structure in which a capacitor element 1z is arranged between the drain electrode 6g in the pair of source and drain electrodes 6f and 6g and the gate electrode 3d. The drain electrode 6g of one of the two semiconductor elements 1y and the source electrode 6f of the other semiconductor element 1y are connected to the sensor signal lines 1j and 1j' and the gate-off wiring line 1m, and the source electrode 6f of the one semiconductor element 1y and the drain electrode 6g of the other semiconductor element 1y are connected to the common wiring line VCOM.

As shown in FIG. 6B, in the two semiconductor elements 1y, the gate electrodes 3d are electrically connected to the control wiring line 1n for setting the semiconductor elements 1y to be in the non-conducting state.

In the capacitive-coupling-operation bidirectional diode element 1d with the above-described structure, the pair of semiconductor elements 1y has the same structure. The cross-sectional structure of the semiconductor elements 1y will be described with reference to FIG. 6C. As shown in FIG. 6C, in the capacitive-coupling-operation bidirectional diode element 1d, as in each of the pixel transistors 1c, the gate electrode 3d of each of the semiconductor elements 1y is disposed on the insulating substrate 11, and the gate insulating film 4 is disposed on the top layer of the gate electrode 3d so as to cover the gate electrode 3d. The semiconductor layer 2c having the channel region is disposed on the top layer of the gate insulating film 4 so as to partially overlap the gate electrode 3d. An ohmic contact layer 7e formed of a doped silicon film and the source electrode 6f in the source and drain electrodes 6f and 6g are laminated at one end of the semiconductor layer 2c, and an ohmic contact layer 7f formed of a doped silicon film and the drain electrode 6g in the source and drain electrodes 6f and 6g are laminated at the other end of the semiconductor layer 2c. The passivation film 8 is disposed on the top layer of the source and drain electrodes 6f and 6g.

The gate electrode 3d has an extending portion to form a lower electrode 3e. The lower electrode 3e faces an upper electrode 6h, which is a portion extending from the drain electrode 6g, via the gate insulating film 4. Thus, the capacitor element 1z is formed.

The source and drain electrodes, the semiconductor layers, and the gate electrodes of the capacitive-coupling-operation bidirectional diode elements 1d are made of the same materials as those of the bidirectional diode elements Di and the pixel transistors 1c, and are disposed between the same pairs of layers as those of the bidirectional diode elements Di and the pixel transistors 1c. The capacitive-coupling-operation bidirectional diode elements 1d, the bidirectional diode elements Di, and the pixel transistors 1c can therefore be fabricated using a common process.

The capacitive-coupling-operation bidirectional diode element 1d with the above-described structure exhibits a rapid increase in the I-V characteristic even 1f parasitic capacitances Cs are generated between the gate electrode 3d and the source electrode 6f and between the gate electrode 3d and the drain electrode 6g. FIGS. 7A and 7B comparatively show I-V characteristics of the capacitive-coupling-operation bidirectional diode element 1d in which a capacitance-to-parasitic-capacitance ratio k (which is a ratio of the capacitance CL of the capacitor element 1z to the parasitic capacitance Cs) varies, and the I-V characteristic of the bi-directional diode element Di shown in FIGS. 5A to 5C. In FIGS. 7A and 7B, characteristic curves L1, L2, L3, L4, and L5 indicate the I-V characteristics of the capacitive-coupling-operation bidirectional diode element 1d in which the capacitance-to-parasitic-capacitance ratio k are 1, 2, 5, 10, and 20, respectively, and a characteristic curve L10 indicates the I-V characteristic of the bi-directional diode element Di shown in FIGS. 5A to 5C.

As shown in FIGS. 7A and 7B, the capacitive-coupling-operation bidirectional diode element 1d exhibits a more rapid increase in the I-V characteristic when the capacitance-to-parasitic-capacitance ratio k is large. In particular, when the capacitance-to-parasitic-capacitance ratio k is 5 or more, like the bi-directional diode element Di shown in FIGS. 5A to 5C, a sufficiently rapid increase in the I-V characteristic can be obtained. That is, when the capacitance-to-parasitic-capacitance ratio k is 5 or more, a sufficiently rapid increase in the I-V characteristic can be obtained without a direct connection between the gate electrodes 3d and the drain electrodes 6g. This can be understood as follows. If the voltage applied across both terminals of the capacitive-coupling-operation bidirectional diode element 1d is denoted by V, the voltage applied to the parasitic capacitance Cs is denoted by V(Cs), and the voltage applied to the capacitor element 1z is denoted by V(CL), the applied voltage V is capacitively divided between the parasitic capacitance Cs and the capacitor element 1z, as given by the following equations:

$$V = V(Cs) + V(CL)$$

$$V(CS) = (CL/(Cs+CL)) \times V$$

$$V(CL) = (Cs/(Cs+CL)) \times V$$

where V(Cs)<V(CL)

As a result, when the capacitance-to-parasitic-capacitance ratio k is 5 or more, the I-V characteristic of the capacitive-coupling-operation bidirectional diode element 1d approaches the I-V characteristic of the bi-directional diode element Di shown in FIGS. 5A to 5C.

Therefore, the capacitive-coupling-operation bidirectional diode element 1d operates as an electrostatic protection element when a high voltage such as static electricity is applied. Since no connection using a relay electrode is required unlike the bidirectional diode element Di shown in FIGS. 5A to 5C, the capacitive-coupling-operation bidirectional diode element 1d can be finished at a relatively early stage of the manufacturing process, and static electricity generated thereafter can be discharged. The sensor elements 1f and 1f' can therefore be protected against static electricity at a relatively early stage of the manufacturing process.

In addition, the control wiring line 1n for setting the semiconductor elements 1y to be in the non-conducting state is electrically connected to the gate electrodes 3d of the two semiconductor elements 1y in the capacitive-coupling-operation bidirectional diode element 1d. Therefore, by applying an off-voltage to the gate electrodes 3d via the control wiring line 1n, the two semiconductor elements 1y can be completely brought into the non-conducting state.

Structure of Sensor Elements 1f and 1f'

Figure 8A:
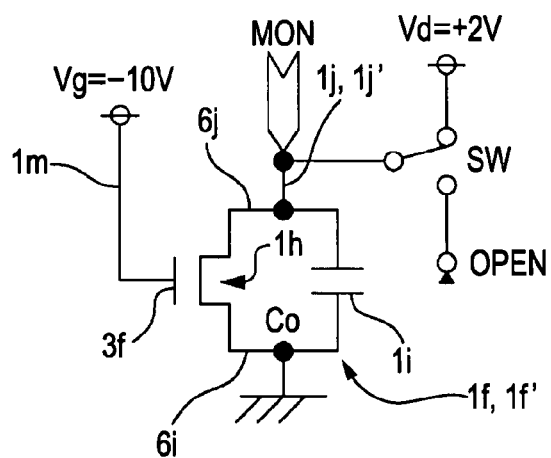
FIGS. 8A and 8B are an equivalent circuit diagram and a plan view of a sensor element disposed on the element substrate used in the liquid crystal device shown in FIGS. 1A and 1B, respectively.
Figure 8B:
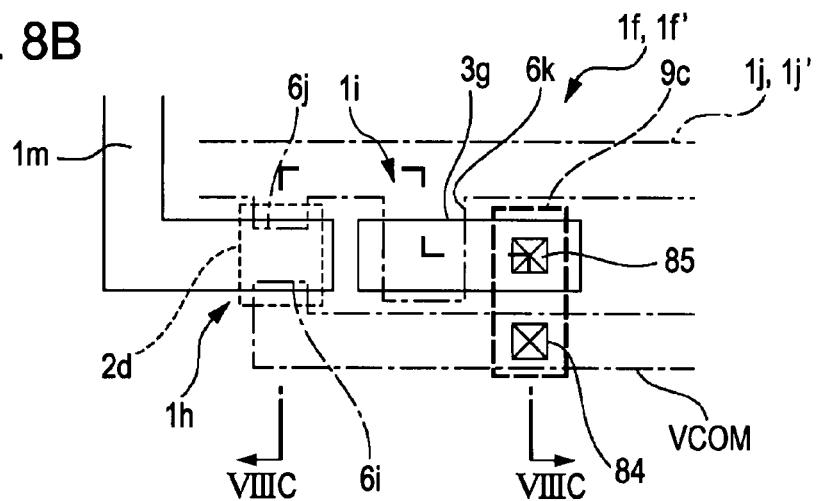
Figure 8C:
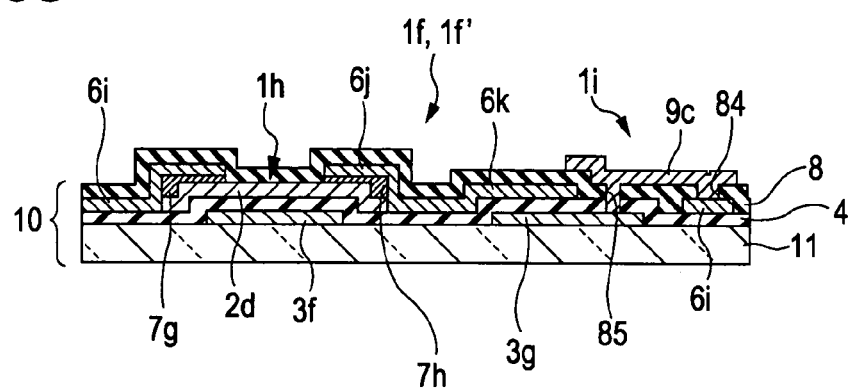
FIG. 8C is a cross-sectional view taken along a line VIIIC-VIIIC of FIG. 7B.

FIGS. 8A and 8B are an equivalent circuit diagram and a plan view of each of the sensor elements 1f and 1f' defined on the element substrate 10, respectively, and FIG. 7C is a cross-sectional view taken along a line VIIIC-VIIIC of FIG. 8B. FIGS. 9A to 9D are graphs showing the discharge characteristic in the sensor elements 1f and 1f' shown in FIGS. 8A to 8C, and FIG. 9E is a graph showing the relationship between the time constant and the illuminance in the sensor elements 1f and 1f'. As shown in FIGS. 8A, 8B, and 8C, the sensor element 1f or 1f' includes an MIS-type semiconductor element 1h including a pair of source and drain electrodes 6i and 6j, a semiconductor layer 2d having a channel region, and a gate electrode 3f facing the channel region with the gate insulating film 4 disposed therebetween, and a capacitor element 1i electrically connected to the semiconductor element 1h in parallel with each other. The drain electrode 6j of the semiconductor element 1h is connected to the sensor signal line 1j or 1j', and the source electrode 6i is connected to the common wiring line VCOM. The gate electrode 3f is electrically connected to the gate-off wiring line 1m for setting the semiconductor element 1h to be in the non-conducting state.

The cross-sectional structure of the sensor element 1f or 1f' with the above-described structure will be described with reference to FIG. 8C. As shown in FIG. 8C, in the sensor element 1f or 1f', as in each of the pixel transistors 1c, the gate electrode 3f of the semiconductor element 1h is disposed on the insulating substrate 11, and the gate insulating film 4 is disposed on the top layer of the gate electrode 3f so as to cover the gate electrode 3f. The semiconductor layer 2d having the channel region is disposed on the top layer of the gate insulating film 4 so as to partially overlap the gate electrode 3f. An ohmic contact layer 7g formed of a doped silicon film and the source electrode 6i in the source and drain electrodes 6i and 6j are laminated at one end of the semiconductor layer 2d, and an ohmic contact layer 7h formed of a doped silicon film and the drain electrode 6j in the source and drain electrodes 6i and 6j are laminated at the other end of the semiconductor layer 2d. The passivation film 8 is disposed on the top layer of the source and drain electrodes 6i and 6j.

An island-shaped lower electrode 3g is further formed concurrently with the gate electrode 3f so as to be arranged side-by-side with respect to the gate electrode 3f. The island-shaped lower electrode 3g faces an upper electrode 6k extending from the drain electrode 6j. A contact hole 85 passing through the gate insulating film 4 and the passivation film 8 is defined at a position overlapping the lower electrode 3g, and a contact hole 84 passing through the passivation film 8 is defined at a position overlapping the source electrode 6i. A relay electrode 9c formed of an ITO film is further disposed on the top layer of the passivation film 8. The relay electrode 9c is electrically connected to the source electrode 6i and the lower electrode 3g via the contact holes 84 and 85, respectively.

The source and drain electrodes, the semiconductor layers, and the gate electrodes of the sensor elements 1f and 1f' are made of the same materials as those of the pixel transistors 1c, the bidirectional diode elements Di, and the capacitive-coupling-operation bidirectional diode elements 1d, and are disposed between the same pairs of layers as those of the pixel transistors 1c, the bidirectional diode elements Di, and the capacitive-coupling-operation bidirectional diode elements 1d. The relay electrodes 9c of the sensor elements 1f and 1f' are made of the same material as that of the pixel electrodes 9a of the pixel transistors 1c and the relay electrodes 9b of the bidirectional diode elements Di, and are disposed on the same layer as that of the pixel electrodes 9a of the pixel transistors 1c and the relay electrodes 9b of the bidirectional diode elements Di. The sensor elements 1f and 1f', the pixel transistors 1c, the bidirectional diode elements Di, and the capacitive-coupling-operation bidirectional diode elements 1d can therefore be fabricated using a common manufacturing process.

In each of the sensor elements 1f and 1f' with the above-described structure, when an illuminance is detected, as shown in FIG. 8A, a gate voltage of, for example, −10 V is applied to the gate electrode 3f via the gate-off wiring line 1m to turn off the semiconductor element 1h, and a voltage of, for example, +2 V is applied between the source and drain electrodes 6i and 6j via the sensor signal line 1j or 1j' to charge the capacitor element 1i. Then, the power supply to the source and drain electrodes 6i and 6j via the sensor signal line 1j or 1j' is stopped. As a result, the inter-terminal voltage of the sensor element 1f or 1f' is output from the sensor signal line 1j or 1j'. The interterminal voltage changes along a discharge curve obtained when the electric charge charged in the capacitor element 1i is discharged via the semiconductor element 1h, and the amount of charge discharged via the semiconductor elements 1h varies depending on the amount of light received by the semiconductor elements 1h. For example, as shown in the discharge characteristics obtained when the illuminance is 10 1x, 10000 1x, 50000 1x, and 150000 1x shown in FIGS. 9A, 9B, 9C, and 9D, respectively, the higher the illuminance, the more rapidly the discharge occurs. As shown in FIG. 9E, the higher the illuminance, the smaller the time constant for the discharging. Therefore, once a time constant is determined, the illuminance can be detected.

Manufacturing Method

The liquid crystal device 100 with the above-described structure is manufactured using a known semiconductor process or the like. That is, although a detailed description is omitted, after the gate electrodes 3b and the scanning lines 3a are formed on the insulating substrate 11, the gate insulating film 4, the semiconductor layers 2a, the ohmic contact layers 7a and 7b, and the source and drain electrodes 6b and 6c are formed. At this time, the pixel transistors 1c and the semiconductor elements 1h of the sensor elements 1f and 1f' have been finished and the capacitive-coupling-operation bidirectional diode elements 1d have also been finished. Thus, static electricity generated in the sensor signal lines 1j and 1j' and the gate-off wiring line 1m after that time can be discharged to the common wiring line VCOM via the capacitive-coupling-operation bidirectional diode elements 1d. The sensor elements 1f can therefore be protected against static electricity.

When the passivation film 8 and the pixel electrodes 9a are formed, the bidirectional diodes Di have been finished. Thus, static electricity generated in the data lines 6a and the scanning line 3a after that time can be discharged to the common wiring line VCOM via the bidirectional diode elements Di. The pixel transistors 1c can therefore be protected against static electricity. After the element substrate 10 is fabricated in this manner, the element substrate 10 and the counter substrate 20 are bonded through the seal 52, and the liquid crystal 50 is injected between the substrates 10 and 20.

Then, the drive ICs 101 and 102 are mounted on the element substrate 10, and the flexible wiring substrate 105 having the sensor-drive IC 103 mounted thereon is connected to the element substrate 10. Thus, the liquid crystal device 100 is finished. The liquid crystal device 100 is incorporated into an electronic apparatus such as a mobile phone.

Sensing Operation

When the electronic apparatus is used, an image is displayed on the liquid crystal device 100, and the display conditions are optimized according to the illuminance detected by the sensor elements 1$f$ and 1$f'$. That is, in the liquid crystal device 100, a gate voltage for turning off the semiconductor elements 1$h$, for example, a voltage of −10 V, is applied to the gate electrodes 3$f$ of the sensor elements 1$f$ and 1$f'$ from the sensor-drive IC 103 via the gate-off wiring line 1$m$, and a constant voltage, for example, a voltage of +2 V, is supplied to the sensor elements 1$f$ and 1$f'$ via the sensor signal lines 1$j$ and 1$j'$ to charge the capacitor elements 1$i$. Then, when the supply of the constant voltage to the sensor elements 1$f$ and 1$f'$ via the sensor signal lines 1$j$ and 1$j'$ is stopped, the sensor elements 1$f$ and 1$f'$ output changes in the inter-terminal voltages (discharge curves) of the sensor elements 1$f$ and 1$f'$ to the sensor-drive IC 103 via the sensor signal lines 1$j$ and 1$j'$. A time constant is determined on the basis of the output results, and therefore the illuminance is determined. By feeding back the detected illuminance to, for example, a backlight device, the display can be performed under conditions suitable for the ambient illuminance. For example, when the ambient illuminance is high, the intensity of light emission from the backlight device increases accordingly to provide bright display, whereas when the ambient illuminance is low, the intensity of light emission from the backlight device decreases accordingly. Further, a signal level specifying the gray levels of an image may be optimized on the basis of the detected illuminance. The illuminance detection operation of the liquid crystal device 100 is performed at predetermined intervals of time during the use of the electronic apparatus or by a button operation by a user.

During that period, a gate voltage for setting the semiconductor elements 1$y$ to be in the non-conducting state is applied to the gate electrodes 3$d$ of the two semiconductor elements 1$y$ used in each of the capacitive-coupling-operation bidirectional diode elements 1$d$ via the control wiring line 1$n$. The capacitive-coupling-operation bidirectional diode elements 1$d$ can therefore be electrically isolated from the sensor signal lines 1$j$ and 1$j'$.

Advantages of Embodiment

As described above, in the liquid crystal device 100 of the embodiment, since the sensor elements 1$f$ and 1$f'$ are arranged on the element substrate 10, the illuminance of the environment where the liquid crystal device 100 is placed can be detected using the sensor elements 1$f$ and 1$f'$. Therefore, an image can be displayed under conditions corresponding to the detected illuminance.

Further, during the manufacturing process of the element substrate 10, the sensor signal lines 1$j$ and 1$j'$ through which signals are output from the sensor elements 1$f$ and 1$f'$, and the gate-off wiring line 1$m$ are electrically connected to the common wiring line VCOM via the capacitive-coupling-operation bidirectional diode elements 1$d$. Therefore, static electricity generated on the element substrate 10 during the manufacturing process of the electro-optical device can be discharged to the common wiring line VCOM via the capacitive-coupling-operation bidirectional diode elements 1$d$, and the sensor elements 1$f$ and 1$f'$ can be protected against static electricity.

The capacitive-coupling-operation bidirectional diode elements 1$d$ connected to the sensor signal lines 1$j$ and 1$j'$ and the gate-off wiring line 1$m$ have a structure in which the capacitor elements 1$z$ are arranged between the drain electrodes 6$g$ and the gate electrodes 3$d$ of the semiconductor elements 1$y$. Thus, when a high voltage caused by static electricity is generated between the common wiring line VCOM and the sensor signal lines 1$j$ and 1$j'$, the capacitive coupling to the parasitic capacitance Cs and the capacitor elements 1$z$ allows the semiconductor elements 1$y$ to be brought into the conducting state. The static electricity can therefore be discharged. Further, the capacitive-coupling-operation bidirectional diode elements 1$d$ are finished at an early stage of the manufacturing process compared with the bidirectional diode element Di described with reference to FIGS. 5A to 5C, and the static electricity generated thereafter can be discharged. The sensor elements 1$f$ and 1$f'$ can therefore be protected against static electricity at a relatively early stage of the manufacturing process.

Further, the control wiring line 1$n$ is disposed for the gate electrodes 3$d$ of the semiconductor elements 1$y$ of the capacitive-coupling-operation bidirectional diode elements 1$d$. Thus, a predetermined gate voltage is applied to the gate electrodes 3$d$ from the control wiring line 1$n$, thereby ensuring that the capacitive-coupling-operation bidirectional diode elements 1$d$ can be brought into the non-conducting state so that the capacitive-coupling-operation bidirectional diode elements 1$d$ do not affect the signals output from the sensor elements 1$f$ and 1$f'$. Therefore, in the case where the sensor signal lines 1$j$ and 1$j'$ defined on the element substrate 10 are electrically connected to the common wiring line VCOM via the bidirectional diode elements Di to protect the sensor elements 1$f$ and 1$f'$ against static electricity, high-accuracy detection can be performed using the sensor elements 1$f$.

Another Embodiment

Figure 10:
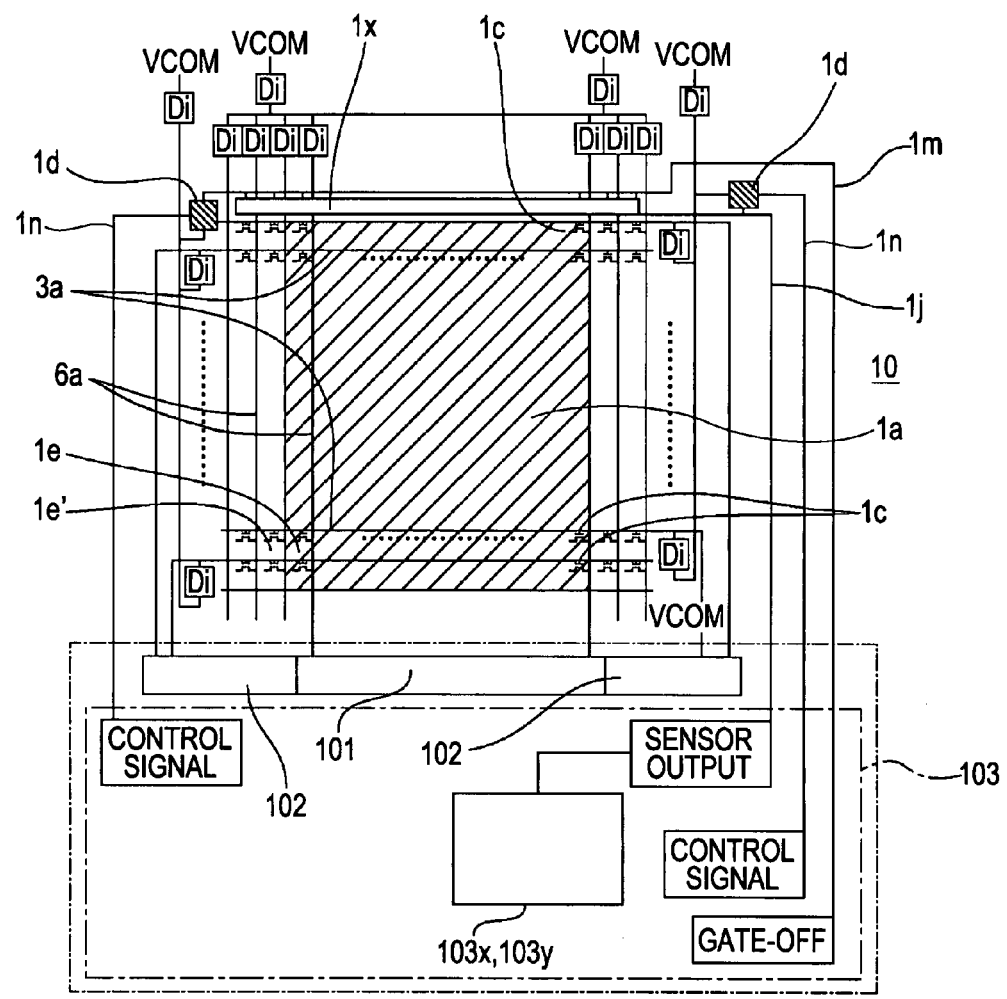
FIG. 10 is a block diagram showing the electrical structure of another element substrate according to the invention.
Figure 11:
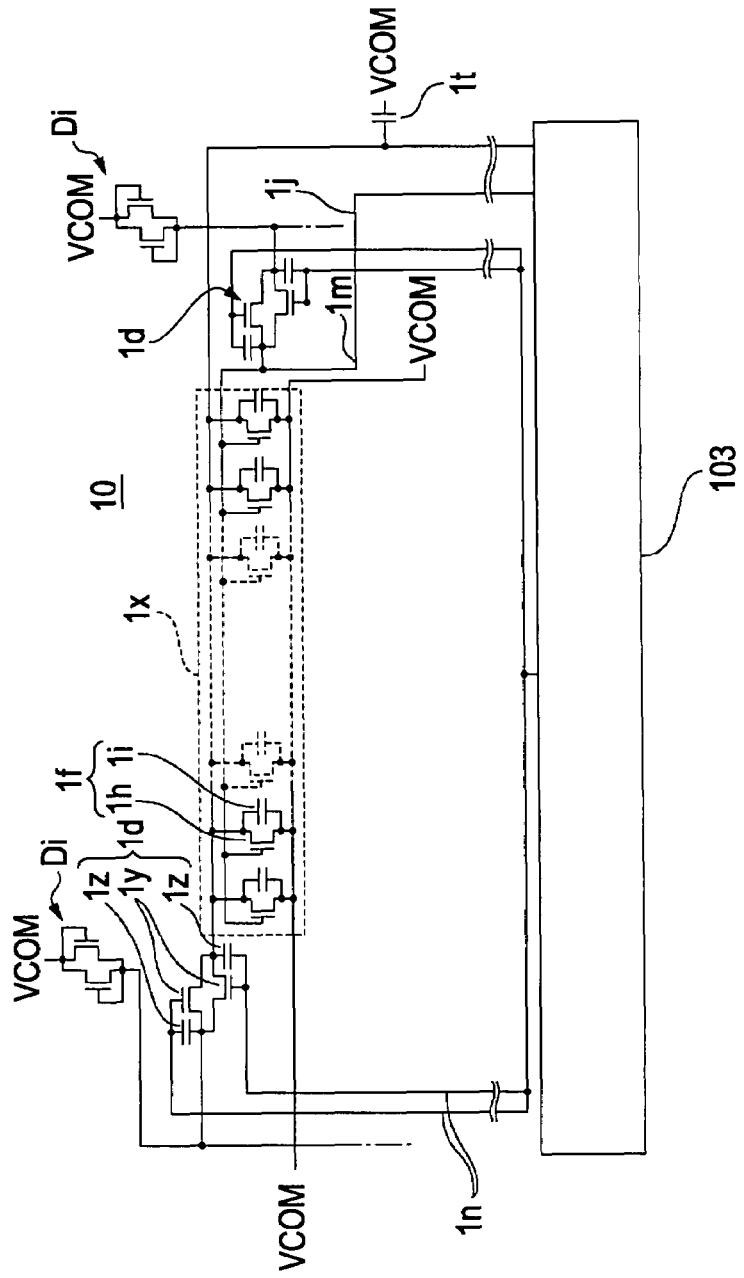
FIG. 11 is a block diagram showing the electrical structure of a sensor element and the like disposed on the element substrate shown in FIG. 10.

FIG. 10 is a block diagram showing the electrical structure of an element substrate 10 according to another embodiment of the invention, and FIG. 11 is a block diagram showing the electrical structure of sensor elements and the like disposed on the element substrate 10. Since the basic structure of this embodiment is similar to that of the embodiment described with reference to FIGS. 3A to 4B, the same or similar components are represented by the same reference numerals, and a description thereof is omitted.

As shown in FIG. 10, also on the element substrate 10 used in a liquid crystal device of this embodiment, a plurality of data lines (source lines) 6$a$ and scanning lines (gate lines) 3$a$ are arranged in a region corresponding to an image display region 1$a$ (as shown by shading) so that the data lines 6$a$ and the scanning lines 3$a$ orthogonally intersect each other, and a plurality of pixel regions 1$e$ are arranged at the intersections of the data lines 6$a$ and the scanning lines 3$a$. Pixel transistors 1$c$ for controlling the alignment of the liquid crystal are disposed in the pixel regions 1$e$, and are formed of MIS-type semiconductor elements (thin-film transistors). The base of the element substrate 10 is formed of an insulating substrate such as a glass substrate. If static electricity is generated in the data lines 6$a$ or the scanning lines 3$a$ during the manufacturing process, the pixel transistors 1$c$ may be damaged by the static electricity. Therefore, a common wiring line VCOM defined on the element substrate 10 is connected to a guard ring (not shown) via the bidirectional diode element Di described with reference to FIGS. 5A to 5C, and electrostatic protection elements each formed of the bidirectional diode element Di are arranged between the common wiring line VCOM and the data lines 6$a$ and between the common wiring line VCOM and the scanning lines 3$a$.

Also in this embodiment, a sensor-element forming region 1x including a plurality of sensor elements 1f is disposed on the element substrate 10 along an edge of the pixel display region 1a. In this embodiment, a temperature is detected using the sensor elements 1f, and no reference sensor elements are disposed. As described with reference to FIGS. 8A to 8C, each of the sensor elements 1f includes a MIS-type semiconductor element 1h, and a capacitor element 1i electrically connected in parallel with the semiconductor element 1h. The element substrate 10 further includes a sensor signal line 1j for outputting signals from first electrodes (the drain electrodes) of the pairs of source and drain electrodes of the sensor elements 1f, and the sensor signal line 1j is electrically connected to a sensor-drive IC 103. The sensor signal line 1j is electrically connected to the common wiring line VCOM via a noise filter element 1t formed of a capacitor. The element substrate 10 further includes a gate-off wiring line 1m extending from the sensor-drive IC 103 toward the sensor-element forming region 1x, and the gate-off wiring line 1m is electrically connected to the gate electrodes of the sensor elements 1f. Second electrodes (the source electrodes) of the pairs of source and drain electrodes of the sensor elements 1f are electrically connected to the common wiring line VCOM. The element substrate 10 further includes electrostatic protection elements each formed of the capacitive-coupling-operation bidirectional diode element 1d between the sensor signal line 1j and the common wiring line VCOM and between the gate-off wiring line 1m and the common wiring line VCOM in order to protect the sensor elements 1f against static electricity. The capacitive-coupling-operation bidirectional diode element 1d includes MIS-type diode elements each including a MIS-type semiconductor element 1y and a capacitor element 1z connected in parallel between the gate electrode and the drain electrode of the semiconductor element 1y so that the MIS-type diode elements are connected in parallel in opposite directions to each other. The element substrate 10 further includes a control wiring line in for supplying a gate voltage setting the semiconductor elements 1y of the capacitive-coupling-operation bidirectional diode element 1d to be in the non-conducting state to the gate electrodes of the semiconductor elements 1y. The control wiring line 1n extends from the sensor-drive IC 103, and is electrically connected to the gate electrodes of the semiconductor elements 1y.

In the liquid crystal device with the above-described structure, the temperature of the environment where the liquid crystal device is placed is detected using the sensor elements 1f, and an image can be displayed under conditions corresponding to the detected temperature. Further, static electricity generated on the element substrate 10 during the manufacturing process of the element substrate 10 can be discharged to the common wiring line VCOM via the capacitive-coupling-operation bidirectional diode elements 1d to protect the sensor elements 1f against static electricity. Since the control wiring line 1n is disposed for the gate electrodes 3d of the semiconductor elements 1y of the capacitive-coupling-operation bidirectional diode elements 1d, a predetermined gate voltage is applied to the gate electrodes 3d from the control wiring line 1n, thereby ensuring that the capacitive-coupling-operation bidirectional diode elements 1d can be brought into the non-conducting state so that the capacitive-coupling-operation bidirectional diode elements 1d do not affect the signals output from the sensor elements 1f. Therefore, in a structure in which the sensor signal line 1j defined on the element substrate 10 is electrically connected to the common wiring line VCOM via the bidirectional diode element Di to protect the sensor elements 1f against static electricity, high-accuracy detection can be performed using the sensor elements 1f.

Other Embodiments

While the foregoing embodiments have been given in the context of the transmissive liquid crystal device 100, the invention can be applied to reflective liquid crystal devices or transflective liquid crystal devices. In the foregoing embodiments, the scanning lines and the like are implemented by a multi-layer film formed of an aluminum alloy film and a molybdenum film, and the data lines are implemented by a multi-layer film formed of an aluminum film and a molybdenum film. Those lines can be implemented by any other metal film, or a conductive film such as a silicide film. While in the foregoing embodiments, the semiconductor layers are implemented by an intrinsic amorphous silicon film, any other silicon film may be used.

In the foregoing embodiments, the active-matrix liquid crystal device 100 of the TN mode, the ECB mode, or the VAN mode is employed by way of example. The invention can also be applied to the liquid crystal device 100 (electro-optical device) of the IPS (In-Plane Switching) mode.

The liquid crystal device 100 is merely an example of electro-optical devices of the invention. Examples of such electro-optical devices may include organic electroluminescent (EL) devices and image pickup devices in which a plurality of data lines and a plurality of scanning lines extend on the element substrate 10 so as to orthogonally intersect each other and pixel regions are arranged at the intersections of the data lines and the scanning lines.

Embodiments of Electronic Apparatus

Figure 12A:
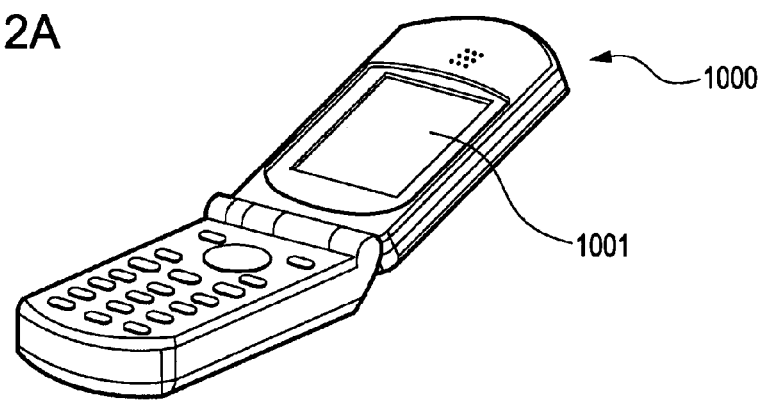
FIGS. 12A to 12C are schematic diagrams of electronic apparatuses including a liquid crystal device according to the invention.
Figure 12B:
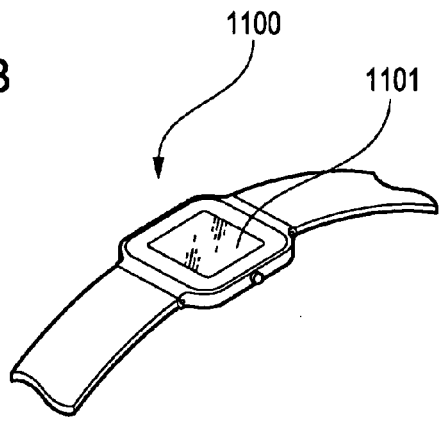
Figure 12C:
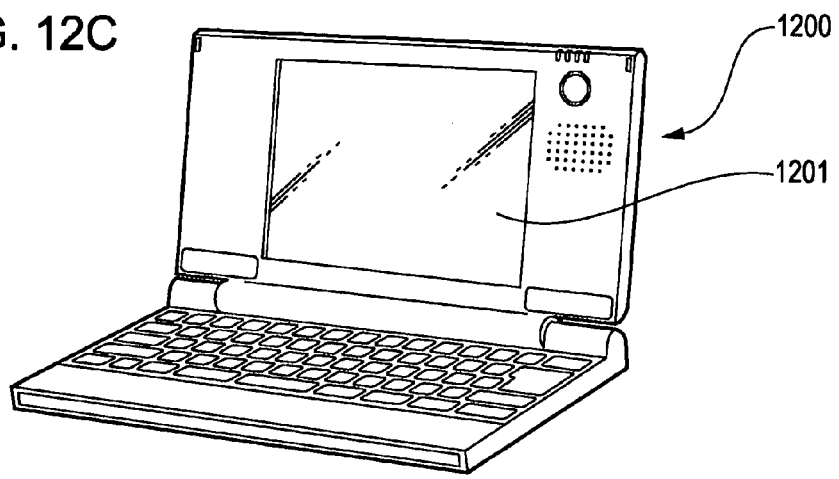

FIGS. 12A to 12C are schematic diagrams of electronic apparatuses including the liquid crystal device 100 according to the invention. The liquid crystal device 100 according to the invention can be incorporated in, for example, a mobile phone 1000 shown in FIG. 12A, a pager 1100 shown in FIG. 12B, and a mobile computer 1200 shown in FIG. 12C. The liquid crystal device 100 forms display units 1001, 1101, and 1201 in those electronic apparatuses. In many cases, those electronic apparatuses are used outdoors. With the use of the liquid crystal device 100 according to the invention, display can be performed under conditions corresponding to the individual use environments. The liquid crystal device 100 according to the invention can also be incorporated as a display device in other apparatuses such as digital still cameras, liquid crystal television sets, view finder-type or monitor direction-view type videotape recorders, car navigation systems, electronic organizers, electronic calculators, word processors, workstations, video telephones, point-of-sale (POS) terminals, and apparatuses equipped with a touch panel.

The entire disclosure of Japanese Patent Application No. 2006-153106, filed Jun. 1, 2006 is expressly incorporated by reference herein.

What is claimed is:

1. An electro-optical device comprising:
an element substrate,
wherein a plurality of data lines, a plurality of scanning lines, and a plurality of pixel transistors connected to the scanning lines and the data lines are disposed on the element substrate,
wherein a sensor element, a sensor signal line for outputting a signal from the sensor element, a common wiring line, and a capacitive-coupling-operation bidirectional diode element are disposed on the element substrate, the capacitive-coupling-operation bidirectional diode element including two capacitive-coupling-operation diode elements each including a semiconductor element including a source electrode, a drain electrode, a semiconductor layer having a channel region, and a gate electrode facing the channel region with a gate insulating film disposed therebetween, and a capacitor element arranged between one of the source electrode and the drain electrode and the gate electrode, the two capacitive-coupling-operation diode elements being electrically connected in opposite directions to each other, the sensor signal line is electrically connected to the common wiring line via the capacitive-coupling-operation bidirectional diode element, and a control wiring line for supplying a gate voltage setting the semiconductor elements of the capacitive-coupling-operation bidirectional diode element to be in a non-conducting state is disposed for the capacitive-coupling-operation bidirectional diode element.

2. The electro-optical device according to claim 1, wherein each of the capacitor elements in the capacitive-coupling-operation bidirectional diode element is formed by arranging the one of the source electrode and the drain electrode so as to face the gate electrode with an insulation film disposed therebetween.

3. The electro-optical device according to claim 1, wherein:

the sensor element includes a semiconductor element including a source electrode, a drain electrode, a semiconductor layer having a channel region, and a gate electrode facing the channel region with the gate insulating film disposed therebetween, and a capacitor element electrically connected to the semiconductor element; and after the capacitor element is charged, a state quantity is detected on the basis of a characteristic of discharging performed via the semiconductor element of the sensor element.

4. The electro-optical device according to claim 3, wherein:

the source electrodes, the drain electrodes, the semiconductor layers, and the gate electrodes of the capacitive-coupling-operation bidirectional diode element are made of the same materials as the materials of the source electrode, the drain electrode, the semiconductor layer, or the gate electrode of the sensor element, respectively; and a pair of layers between which the source electrodes, the drain electrodes, the semiconductor layers, or the gate electrodes of the capacitive-coupling-operation bidirectional diode element are disposed is the same as a pair of layers between which the source electrode, the drain electrode, the semiconductor layer, or the gate electrode of the sensor element is disposed, respectively.

5. The electro-optical device according to claim 3, wherein the channel region of the sensor element is formed of an amorphous silicon film.

6. The electro-optical device according to claim 1, wherein the sensor element is an optical sensor.

7. The electro-optical device according to claim 1, wherein the sensor element is a temperature sensor.

8. The electro-optical device according to claim 1, wherein:

each of the pixel transistor including a source electrode, a drain electrode, a semiconductor layer having a channel region, and a gate electrode facing the channel region with the gate insulating film disposed therebetween, the source electrodes, the drain electrodes, the semiconductor layers, and the gate electrodes of the pixel transistors are made of the same materials as the materials of the source electrodes, the drain electrodes, the semiconductor layers, or the gate electrodes of the capacitive-coupling-operation bidirectional diode element, respectively; and a pair of layers between which the source electrodes, the drain electrodes, the semiconductor layers, or the gate electrodes of the pixel transistors are disposed is the same as a pair of layers between which the source electrodes, the drain electrodes, the semiconductor layers, or the gate electrodes of the capacitive-coupling-operation bidirectional diode element are disposed, respectively.

9. An electronic apparatus comprising the electro-optical device according to claim 1.

* * * * *